(12) United States Patent
Dehe et al.

(10) Patent No.: US 9,458,009 B2
(45) Date of Patent: Oct. 4, 2016

(54) SEMICONDUCTOR DEVICES AND METHODS OF FORMING THEREOF

(71) Applicant: Infineon Technologies AG, Neubiberg (DE)

(72) Inventors: Alfons Dehe, Reutlingen (DE); Carsten Ahrens, Pettendorf (DE); Stefan Barzen, Munich (DE); Wolfgang Friza, Villach (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/798,112

(22) Filed: Jul. 13, 2015

(65) Prior Publication Data

US 2015/0321901 A1    Nov. 12, 2015

Related U.S. Application Data

(62) Division of application No. 13/804,934, filed on Mar. 14, 2013, now Pat. No. 9,102,519.

(51) Int. Cl.
*B81C 1/00* (2006.01)
*B81B 3/00* (2006.01)

(52) U.S. Cl.
CPC ............ *B81B 3/0072* (2013.01); *B81B 3/001* (2013.01); *B81B 3/0027* (2013.01); *B81C 1/00182* (2013.01); *B81C 1/00404* (2013.01); *B81C 1/00984* (2013.01); *B81B 2201/0257* (2013.01); *B81B 2203/0127* (2013.01); *B81B 2203/0315* (2013.01); *B81C 2201/017* (2013.01); *B81C 2201/115* (2013.01)

(58) Field of Classification Search
CPC ..... H01L 29/84; H01L 21/306; B81B 3/001; B81B 3/0021; B81B 1/00158; B81C 1/00404
USPC ........................................................ 257/416
See application file for complete search history.

(56) References Cited

U.S. PATENT DOCUMENTS

| | | | |
|---|---|---|---|
| 7,473,572 B2 | 1/2009 | Dehe et al. | |
| 8,455,963 B1 | 6/2013 | Adler et al. | |
| 2005/0262947 A1 | 12/2005 | Dehe | |
| 2007/0034976 A1 | 2/2007 | Barzen et al. | |
| 2009/0029501 A1 | 1/2009 | Weigold | |

(Continued)

FOREIGN PATENT DOCUMENTS

| | | |
|---|---|---|
| EP | 2535310 A2 | 12/2012 |
| WO | 03022732 | 3/2003 |

*Primary Examiner* — Nathan W Ha
(74) *Attorney, Agent, or Firm* — Slater Matsil, LLP

(57) ABSTRACT

In accordance with an embodiment of the present invention, a method of forming a semiconductor device includes forming a sacrificial layer over a first surface of a workpiece having the first surface and an opposite second surface. A membrane is formed over the sacrificial layer. A through hole is etched through the workpiece from the second surface to expose a surface of the sacrificial layer. At least a portion of the sacrificial layer is removed from the second surface to form a cavity under the membrane. The cavity is aligned with the membrane.

23 Claims, 30 Drawing Sheets

(56) References Cited

U.S. PATENT DOCUMENTS

| | | |
|---|---|---|
| 2010/0065930 A1 | 3/2010 | Nakatani |
| 2010/0084721 A1 | 4/2010 | Wu et al. |
| 2011/0108933 A1 | 5/2011 | Nakatani |
| 2011/0303994 A1 | 12/2011 | Jenkins et al. |
| 2011/0315526 A1* | 12/2011 | Jahnes ............... B81C 1/00476 200/181 |
| 2011/0315528 A1* | 12/2011 | Herrin ................. B81C 1/00476 200/181 |
| 2011/0316097 A1* | 12/2011 | Herrin ................. G06F 17/5072 257/415 |
| 2012/0299130 A1 | 11/2012 | Langereis et al. |
| 2012/0319217 A1 | 12/2012 | Dehe et al. |
| 2013/0095593 A1 | 4/2013 | Hsieh et al. |
| 2013/0140654 A1 | 6/2013 | Adler et al. |

* cited by examiner

SEMICONDUCTOR DEVICES AND METHODS OF FORMING THEREOF

The present application is a divisional application of U.S. patent application Ser. No. 13/804,934 filed on Mar. 14, 2013, which is incorporated herein by reference.

TECHNICAL FIELD

The present invention relates generally to semiconductor devices, and more particularly to semiconductor devices and methods of forming thereof.

BACKGROUND

Small electromechanical components can be manufactured using micro-electromechanical systems (MEMS) technology using microelectronics manufacturing processes. MEMS devices include thin membranes and beams, which function as mechanical and/or electrical components.

Silicon microphones are a type of MEMS device in which the MEMS structure or a membrane actuates with acoustic signals. However, process variations during manufacturing of the silicon microphone may result in variations in membrane sensitivity, noise, parasitic effects, and others.

SUMMARY OF THE INVENTION

In accordance with an embodiment of the present invention, a method of forming a semiconductor device comprises forming a sacrificial layer over a first surface of a workpiece having the first surface and an opposite second surface. A membrane is formed over the sacrificial layer. A through hole is formed through the workpiece from the second surface to expose a surface of the sacrificial layer. At least a portion of the sacrificial layer is removed from the second surface to form a cavity under the membrane. The cavity is aligned with the membrane.

In accordance with an embodiment of the present invention, a method of forming a semiconductor device comprises forming a plurality of trenches comprising a fill material in a workpiece from a first surface of the workpiece, which has the first surface and an opposite second surface. A first sacrificial layer is formed over the plurality of trenches. A membrane is formed over the first sacrificial layer. The fill material is removed from the plurality of trenches to expose a surface of the first sacrificial layer from the second surface. At least a portion of the first sacrificial layer is removed.

In accordance with an alternative embodiment of the present invention, a method of forming a semiconductor device comprises forming a first sacrificial layer in a workpiece having a first surface and an opposite second surface. A second sacrificial layer is formed over the first surface of the workpiece. The second sacrificial layer is aligned to the first sacrificial layer. The membrane is formed over the second sacrificial layer. The surface of the second sacrificial layer is exposed. The first sacrificial layer and at least a portion of the second sacrificial layer is removed to form a cavity under the membrane. The cavity is aligned with the membrane.

In accordance with an alternative embodiment of the present invention, a method of forming a semiconductor device comprises forming a sacrificial layer over a first surface of a workpiece having the first surface and an opposite second surface. A membrane is formed over the sacrificial layer. The workpiece is thinned from the second surface. After thinning the workpiece, at least a portion of the sacrificial layer is removed to form a cavity under the membrane. The cavity is aligned with the membrane.

In accordance with an embodiment of the present invention, a semiconductor device comprises a first cavity disposed in a substrate having a first surface and an opposite second surface. The first cavity extends from a first surface into a substrate. A second cavity is disposed in the substrate. The second cavity extends from the second surface to the first cavity to form a continuous cavity. The first cavity comprises a first center point while the second cavity comprises a second center point. The first cavity at least partially overlaps the second cavity. A moveable membrane layer is disposed over the second surface of the substrate. The moveable portion of the moveable membrane layer comprises a third center point. The third center point and the second center point are aligned.

BRIEF DESCRIPTION OF THE DRAWINGS

For a more complete understanding of the present invention, and the advantages thereof, reference is now made to the following descriptions taken in conjunction with the accompanying drawing, in which:

FIG. 1, which includes FIGS. 1A and 1B, illustrates a MEMS device in accordance with an embodiment of the invention, wherein FIG. 1A illustrates a cross sectional view and FIG. 1B illustrates a top view;

FIG. 25, which includes

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to various embodiments in a specific context, namely a Micro electro-mechanical systems (MEMS) sensor. The invention may also be applied, however, to other types of semiconductor devices.

A structural embodiment of the present invention will be described using FIG. 1. A method of fabricating the MEMS device will be described using FIGS. 2-8. Further, alternative embodiments will be described using FIGS. 9-16, 17-23, 24, 25, 26-30, 34-42.

Figure 1A:
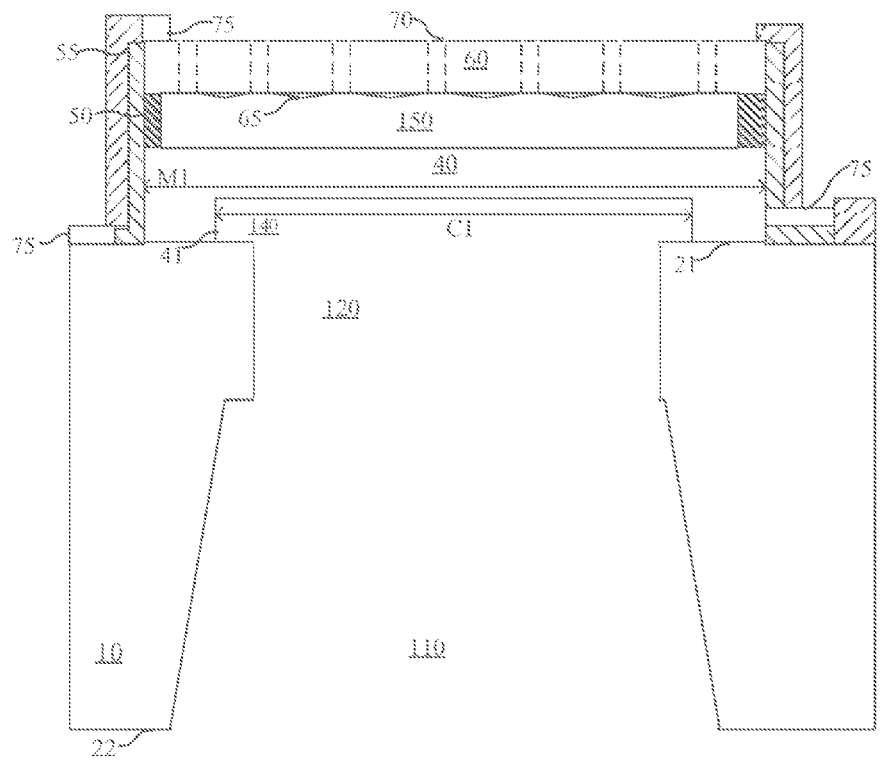
Figure 1B:
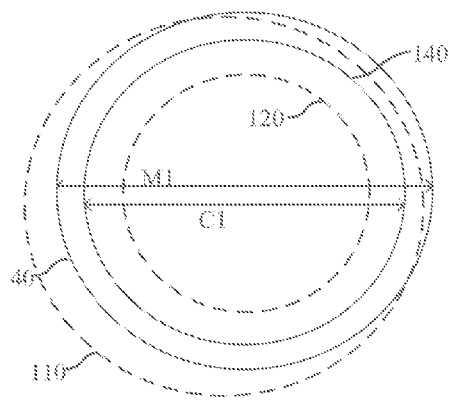

FIG. 1, which includes FIGS. 1A and 1B, illustrates a MEMS device in accordance with an embodiment of the invention, wherein FIG. 1A illustrates a cross sectional view and FIG. 1B illustrates a top view.

Referring to FIG. 1A, the MEMS device comprises a membrane layer 40 disposed over a substrate 10. The membrane layer 40 is held over the substrate 10 and may be supported by support structures such as spacers 55. As will be described with respect to alternative embodiments, the membrane layer 40 may include corrugations.

The MEMS device further comprises a back plate 60 disposed above the membrane layer 40. A plurality of bumps 65 may be disposed on the back surface of the back plate 60. Contacts 75 electrically couple to the back plate 60, the membrane layer 40, and the substrate 10. The plurality of bumps 65 may prevent the membrane layer 40 from sticking to the back plate 60 by minimizing the contact surface area when the membrane layer 40 deflects towards the back plate 60. The back plate 60 may also include a plurality of etch holes 70.

The MEMS device further includes a central cavity comprising a plurality of connected cavities. As an illustration, a first cavity 110 is disposed in the substrate 10 and extends from the back surface 22 into the substrate 10. A second cavity 120 extends from the first cavity 110 upto the front surface 21 of the substrate 10. A third cavity 140 is disposed above the front surface 21 of the substrate 10 and below the membrane layer 40. A gap 150 is disposed between the back plate 60 and the membrane layer 40 and may disposed within a removable material layer 50. The third cavity 140 and the gap 150 allow the membrane layer 40 to oscillate.

In various embodiments, the third cavity 140 is aligned with the membrane layer 40. Further, the second cavity 120 (if present) may be aligned with the third cavity 140. However, the first cavity 110 may not be aligned with the second cavity 120 or the third cavity 140.

As illustrated, the third cavity 140 may have a first diameter C1 while the membrane layer 40 has a second diameter M1. As further illustrated in FIG. 1B, the membrane layer 40 is aligned to the third cavity 140 and the second cavity 120. However, the first cavity 110 may be misaligned relative to the second cavity 120, and the third cavity 140. For example, as illustrated in FIG. 1B, the second cavity 120, the third cavity 140, and the membrane layer 40 have a common center point while the first cavity 110 has a center point spaced laterally away from this common center point in one embodiment.

In various embodiments, the degree of misalignment between the third cavity 140 and the membrane layer 40 is less than 0.1%, or between about 0.01% to about 0.5%. The degree of misalignment is the distance between the center of the membrane layer 40 to the center of the third cavity 140 divided by the diameter of the membrane layer 40. Similarly, the degree of misalignment between the second cavity 120 and the membrane layer 40 is less than 0.1%, or between about 0.01% to about 0.5%.

However, the degree of misalignment between the third cavity 140 and the membrane layer 40 may be more than 0.1%, and about 1% to about 10% in one or more embodiments.

Advantageously, embodiments of the present invention enable a tighter control of the diameter of the suspended membrane layer 40. Further, in various embodiments, the surface of the membrane layer 40 may have a very low surface roughness, for example, a root mean square roughness between about 0.1 nm to about 1 nm. In some embodiments (e.g., as further illustrated in FIG. 8), the sidewall 41 of the membrane layer 40 may have a soft curvature helping to avoid any stress concentration at the corners.

FIGS. 2-8 illustrates an embodiment of fabricating the semiconductor device comprising a moveable membrane layer using a local oxidation process in accordance with embodiments of the invention.

Figure 2:
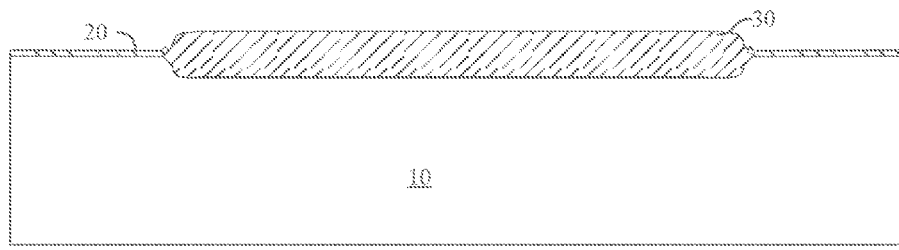
FIGS. 2-8 illustrates an embodiment of fabricating the semiconductor device comprising a moveable membrane layer using a local oxidation process in accordance with embodiments of the invention.

FIG. 2 illustrates a semiconductor substrate after forming local oxidation regions in accordance with an embodiment of the present invention.

FIG. 2 illustrates a masking layer 20 formed over a substrate 10. The substrate 10 may be a semiconductor substrate in various embodiments. The substrate 10 may be a semiconductor bulk substrate or a semiconductor on insulator substrate in some embodiments. Some examples of the substrate 10 include a bulk mono-crystalline silicon substrate (or a layer grown thereon or otherwise formed therein), a layer of {110} silicon on a {100} silicon wafer, a layer of a silicon-on-insulator (SOI) wafer, or a layer of a germanium-on-insulator (GeOI) wafer. In various embodiments, the substrate 10 may include blanket epitaxial layers. In various embodiments, the substrate 10 may be a silicon wafer, a germanium wafer, or may be a compound semiconductor substrate including indium antimonide, indium arsenide, indium phosphide, gallium nitride, gallium arsenide, gallium antimonide or combinations thereof. In one embodiment, the substrate 10 may comprise a heteroepitaxial layer such as a gallium nitride grown on a silicon wafer.

The masking layer 20 comprises an insulating layer in various embodiments. The masking layer 20 may be a nitride in one embodiment. In another embodiment, the masking layer 20 may be an oxide. The masking layer 20 may be formed by thermal oxidation or nitridation, or using vapor deposition processes such as chemical vapor deposition, plasma vapor deposition.

The masking layer 20 may comprise a hard mask material in one embodiment. In various embodiments, the masking layer 20 may comprise a nitride material such as silicon nitride. In one or more embodiments, the masking layer 20 comprises a pad oxide layer and a silicon nitride layer over the pad oxide layer. In an alternative embodiment, the masking layer 20 comprises a pad oxide layer, a poly silicon layer over the pad oxide layer, and a silicon nitride layer over the poly silicon layer. In another alternative embodiment, the masking layer 20 comprises a pad oxide layer, an amorphous silicon layer over the pad oxide layer, and a silicon nitride layer over the amorphous silicon layer.

The masking layer 20 is patterned for forming regions of local oxide. The masking layer 20 is patterned, e.g., by depositing a layer of photosensitive material (not shown) such as a photo resist over the masking layer 20. The layer of photosensitive material is patterned using a lithography process, e.g., by exposure to light or radiation to transfer a pattern from a lithography mask (not shown) to the layer of photosensitive material, and the photosensitive material is developed. The layer of photosensitive material is then used as an etch mask while portions of the masking layer 20 are etched away, leaving the structure shown in FIG. 2.

A local oxidation is performed to form oxide regions 30. As will be described further below, the oxide regions 30 define the structures for the cavity over which a moveable membrane is suspended. Exposed portions of the substrate 10 are oxidized using a thermal oxidation process to form oxide regions 30. The masking layer 20 blocks oxidation of the underlying substrate 10. Therefore, the oxidation proceeds locally. In one or more embodiments, the masking layer 20 protects other regions (such as other device regions) of the substrate 10 from being oxidized while forming a thick local oxide in exposed portions of the substrate 10.

In various embodiments, the oxidation may be performed using a dry oxidation, wet oxidation, a water ambient, or a mixed ambient. For example, the substrate 10 may be exposed to an oxygen-containing substance, a silicon-containing substance, and/or increased temperature to convert a portion of the substrate 10 into an oxide material.

During the oxidation process, a surface layer of silicon reacts to form an oxide. Subsequent oxidation progresses by diffusion of oxygen through the oxide layer and reacting at the interface between the growing oxide and the substrate 10.

In an alternative embodiment, a smoothing layer may be deposited over the substrate 10 before forming the masking layer 20. The smoothing layer may be formed as a blanket layer or alternatively, over the substrate 10 only in the regions of the MEMS device that is being fabricated. The smoothing layer may be a poly silicon layer in one embodiment and may result in smoother corners due to improved stress relaxation during the oxidation process.

Similarly, in an alternative embodiment, the substrate 10 may be etched using an anisotropic or isotropic etch before exposing to the oxidation process. This may allow tailoring of the lateral profile of the oxide regions 30 formed under the masking layer 20.

In various embodiments, the oxidation process is continued to form oxide regions 30 having a depth of about 1000 nm to about 6000 nm, and having a width of about 100 μm to about 2000 μm.

Because of the nature of the oxidation process a portion of the oxide regions 30 protrudes above the top surface of the substrate 10. Further, the oxide regions 30 have a smooth interface (silicon/oxide boundary) because of the oxidation process. Oxidation, unlike deposition processes, is a diffusion-reaction process involving high temperatures and relatively slower oxidation rates, which results in an interface having no sharp edges between the substrate 10 and the oxide regions 30. In some embodiments, further smoothing may be performed, for example, by the use of additional anneals such as in a hydrogen atmosphere. The hydrogen anneal may further smooth the oxide regions 30 particularly around the corners and result in a smooth profile.

Figure 3:
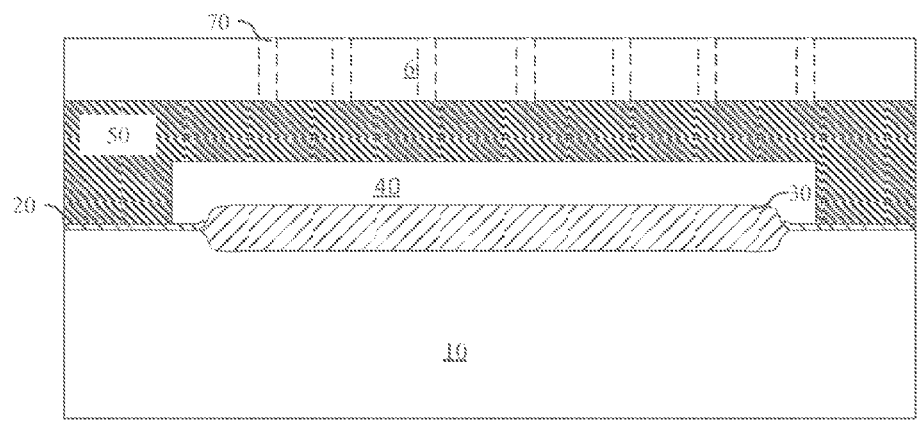

FIG. 3 illustrates a semiconductor device after depositing a membrane layer, a removable material layer, and a back plate layer in accordance with an embodiment of the present invention.

Next, as illustrated in FIG. 3, a membrane layer 40 is deposited over the oxide regions 30. The membrane layer 40 may form an electrode of a capacitor in various embodiments. In one embodiment, the membrane layer 40 forming the capacitor is part of a capacitive microphone.

In one embodiment, the membrane layer 40 comprises a poly silicon layer. In an alternative embodiment, the membrane layer 40 comprises an amorphous silicon layer. In alternative embodiments, the membrane layer 40 comprises a conductive layer. The membrane layer 40 has a thickness of about 100 nm to about 2000 nm in various embodiments. In one or more embodiments, the membrane layer 40 has a thickness of about 200 nm to about 1000 nm, and about 330 nm in one embodiment.

The membrane layer 40 may be patterned. The membrane layer 40 is removed from other regions of the substrate 10. In some embodiments, the membrane layer 40 may be patterned along with the patterning of the subsequently deposited back plate.

A removable material layer 50 is deposited over the membrane layer 40. In one or more embodiments, the removable material layer 50 may comprise an oxide, such as tetra ethyl oxysilane (TEOS). In some embodiments, the removable material layer 50 may be patterned with recess and filled with one or more layers of a liner, which form the plurality of bumps 65 illustrated in FIG. 1A.

A back plate 60 is deposited over the removable material layer 50. In various embodiments, the back plate 60 forms a portion of a capacitor, for example, a portion of a capacitive microphone. The back plate 60 may comprise a poly silicon material in one embodiment.

Figure 4:
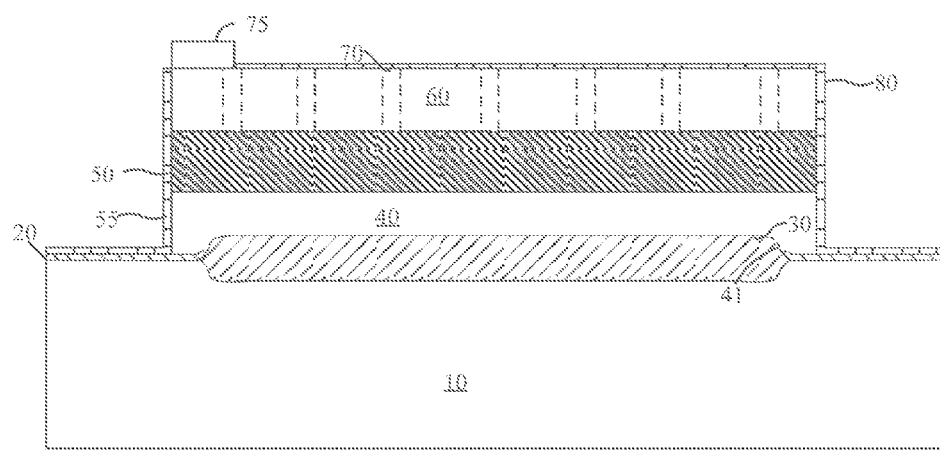

FIG. 4 illustrates a semiconductor device after patterning the membrane layer, the removable material layer, and the back plate layer in accordance with an embodiment of the present invention.

Referring to FIG. 4, the back plate 60 and the underlying removable material layer 50 are patterned. During the patterning of the back plate 60, a plurality of holes 70 may be formed within the back plate 60.

A dielectric layer 80 may be deposited and opened for contact formation. The dielectric layer may form the spacer 55 around the outer sidewalls of the membrane layer 40, the removable material layer 50 and the back plate 60 and helps to secure these layers by providing mechanical support.

Contacts 75 may be formed for contacting the substrate 10, the membrane layer 40, and the back plate 60. The contacts 75 are formed after masking and patterning the dielectric layer 80, which may also help to protect the plurality of holes 70 during subsequent processing.

As illustrated in FIG. 4, the inner sidewall 41 of the membrane layer 40 is aligned with the outer top surface of the oxide regions 30. As a consequence, the membrane layer 40 is self-aligned with the oxide regions 30 and does not require a separate masking step to align the inner edge of the membrane layer 40 with the oxide regions 30. The distance between the inner edges of the membrane layer 40 determines the diameter of the suspended portion of the membrane layer 40, which directly impacts the oscillating characteristics of the membrane layer 40.

Figure 5:
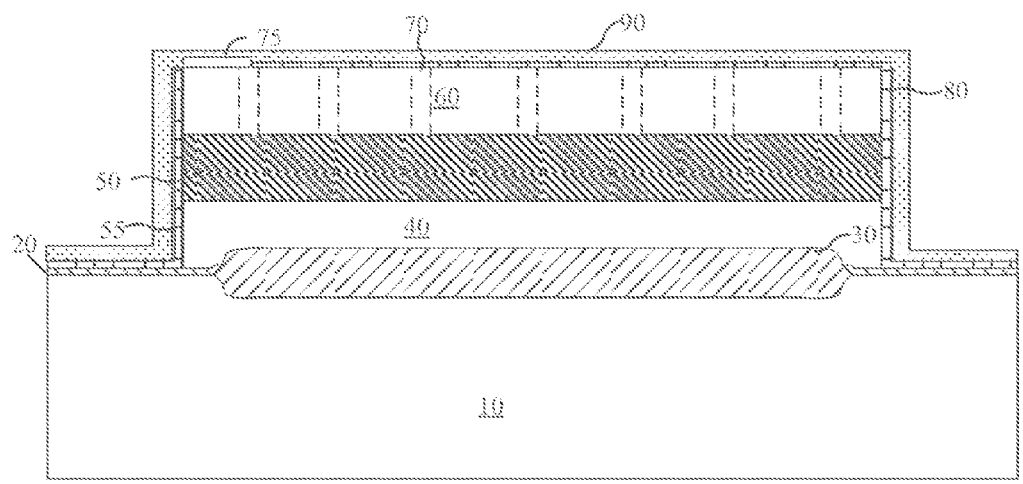

FIG. 5 illustrates a semiconductor device after completing front side processing prior to back side processing in accordance with an embodiment of the present invention.

Referring to FIG. 5, the front side is protected by forming a protective layer 90. The protective layer 90 protects the front side during the subsequent back side processing. In various embodiments, the protective layer 90 may comprise silicon nitride or silicon oxide.

Figure 6:
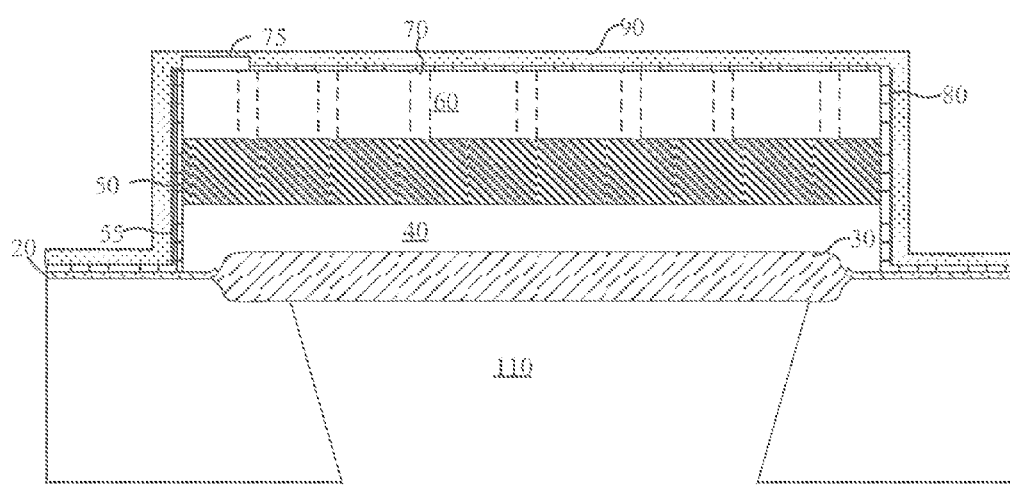

FIG. 6 illustrates a semiconductor device after forming a cavity under the oxide regions in accordance with an embodiment of the present invention.

Back side processing continues from FIG. 6 to form a first cavity 110. The substrate 10 is reversed or flipped upside down to expose the back side. Next a resist is deposited on the exposed back side and patterned (not shown) and a portion of the substrate 10 in the MEMS device region is exposed. The exposed substrate 10 is etched until the oxide regions 30 are exposed.

In various embodiments, the substrate 10 may be etched using a Bosch Process, or by depositing a hard mask layer and etching the substrate 10 using a vertical reactive ion etch process. In one embodiment, only a resist mask is used. If the resist budget is not sufficient, the hard mask and vertical reactive ion etch may be used to achieve a smooth sidewall. However, this integration scheme requires the removal of remaining hard mask residues. Hence, in some embodiments, a Bosch process may be used without additional hard mask.

In the Bosch process, a isotropic plasma etch step and passivation layer deposition step are alternated. The etching/deposition steps are repeated many times during the Bosch process. The plasma etch is configured to etch vertically, e.g., using Sulfur hexafluoride [$SF_6$] in the plasma. The passivation layer is deposited, for example, using octa-fluoro-cyclobutane as a source gas. Each individual step may be turned on for a few seconds or less. The passivation layer protects the substrate 10 and prevents further etching. However, during the plasma etching phase, the directional ions that bombard the substrate remove the passivation layer at the bottom of the trench (but not along the sides) and etching continues. The Bosch process is stopped when the oxide regions 30 are exposed. The Bosch process produces sidewalls that are scalloped.

Figure 7:
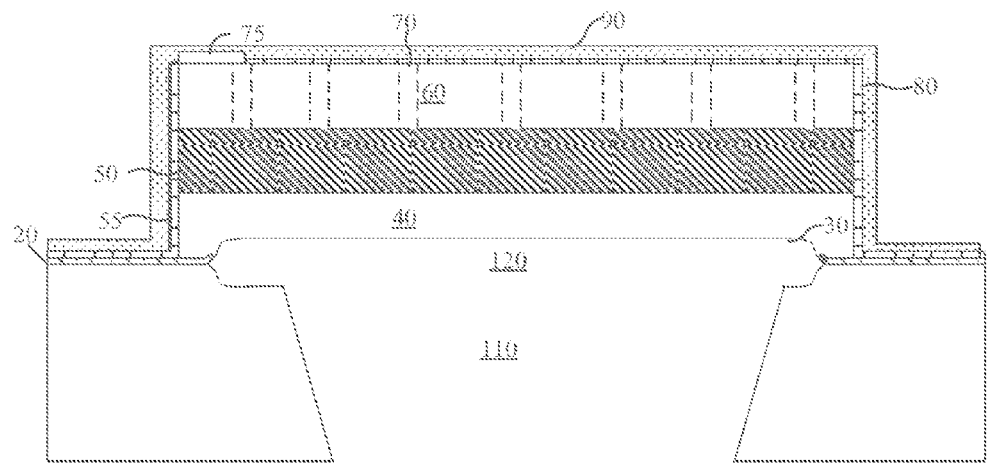

FIG. 7 illustrates a semiconductor device after removing the oxide region under the membrane layer in accordance with an embodiment of the present invention.

Referring next to FIG. 7, the oxide regions 30 are removed to form a second cavity 120, for example, using a wet etch chemistry. The wet etch stops after the membrane layer 40 is exposed. Advantageously, the location of the second cavity 120 relative to the membrane layer 40 is independent of the location of the first cavity 110. In other words, due to misalignment of the back side mask process, the first cavity 110 may not be formed aligned with the oxide regions 30. However, the release etch process for removing the oxide regions 30 is laterally stopped and is therefore aligned with membrane layer 40. Advantageously, this allows robust clamping of the membrane layer 40 and minimizes overlap between the membrane layer 40 and the substrate 10, which reduces parasitic capacitance effects.

Figure 8:
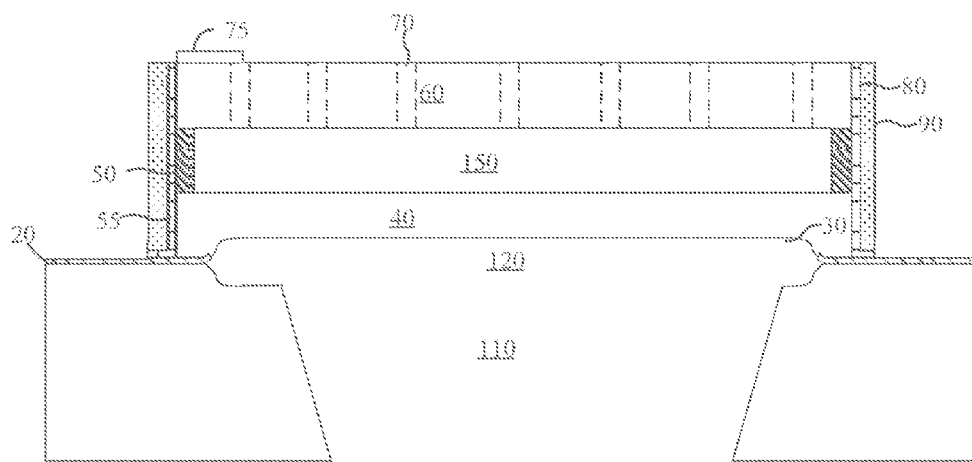

FIG. 8 illustrates a semiconductor device after forming releasing the membrane layer in accordance with an embodiment of the present invention.

Referring to FIG. 8, the front side is patterned to open the MEMS device area while protecting the remaining regions, for example, the contacts 75. A resist is deposited over the front side and patterned. The resist may comprise a silicon nitride material in one embodiment, and may comprise a hard mask in one embodiment. Thus, the MEMS device region may be exposed to a wet etch process that may be able to efficiently remove a particular type of material.

The protective layer 90 may be removed in accordance with an embodiment of the present invention. In one or more embodiments, the protective layer 90 may be etched, using an anisotropic etch process, leaving a support spacer. The removable material layer 50 may etched using a wet etch process, for example, a timed isotropic wet etch to form a gap 150. In some embodiments, the protective layer 90, the dielectric layer 80, the removable material layer 50 may be removed during the same step. In an alternative embodiments, the oxide regions 30 and the removable material layer 50 may be etched using a common etching process.

While embodiments of the invention are described having a back plate 60, in other embodiments these may be not used. For example, embodiments of the invention include MEMS applications requiring a membrane layer 40 but without a back plate 60, e.g., pressure sensing with piezoelectric, piezoresistive, or optical techniques. Similarly embodiments of the invention may include multiple back plates, for example, capacitive sensors/actuators where the membrane layer 40 may be sandwiched between two back plates for differential read out or push-pull actuation.

FIGS. 9-16 illustrates an embodiment of fabricating the semiconductor device comprising a moveable membrane layer having corrugations using a local oxidation process in accordance with an alternative embodiment of the invention.

FIGS. 9-16 illustrates an embodiment of a MEMS device in which the membrane layer includes multiple corrugations. In various embodiments, the number of corrugations may be chosen to optimize the stress in the membrane layer 40. Therefore, embodiments of the invention may be fabricated using multiple oxide regions 30, which results in increasing the number of corrugations. This embodiments illustrates three corrugations, and in various more number of corrugations may be formed.

Figure 9:
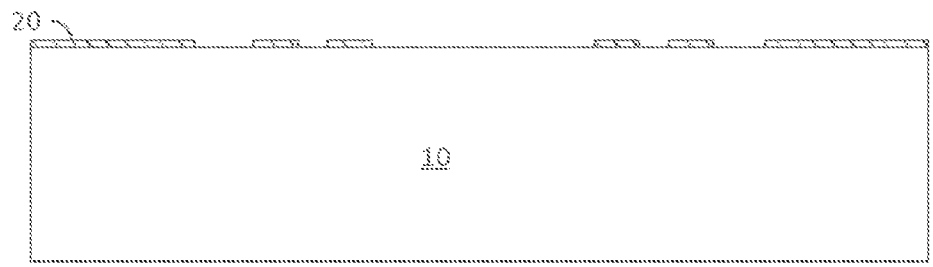
FIGS. 9-16 illustrates an embodiment of fabricating the semiconductor device comprising a moveable membrane layer having corrugations using a local oxidation process in accordance with an alternative embodiment of the invention.

FIG. 9 illustrates a semiconductor device during fabrication after forming a structured masking layer in accordance with an embodiment of the present invention.

Referring to FIG. 9, a masking layer 20 is deposited as in the prior embodiment. However, the masking layer 20 is patterned differently in this embodiment. A plurality of openings are formed in the masking layer 20.

Figure 10A:
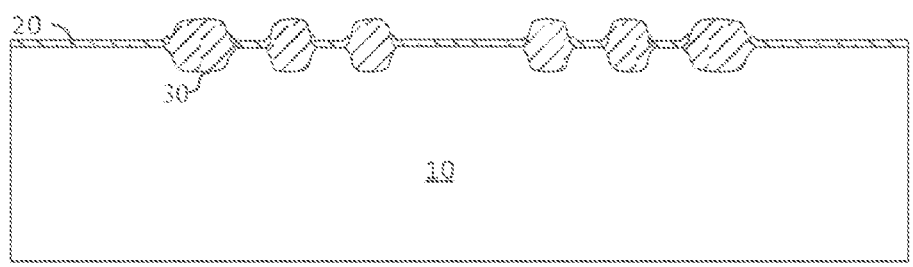
Figure 10B:
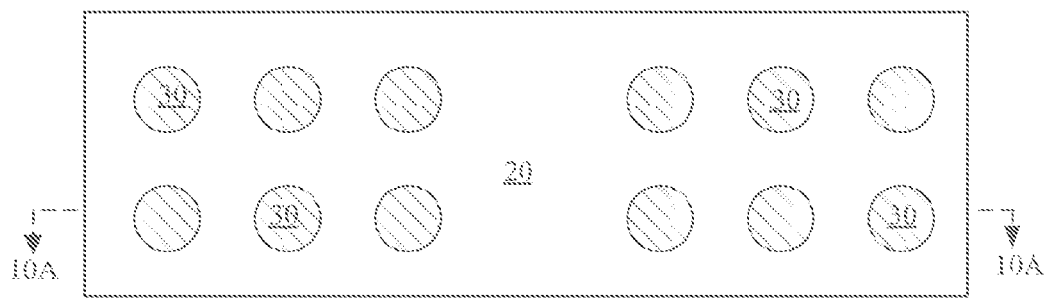
Figure 10C:
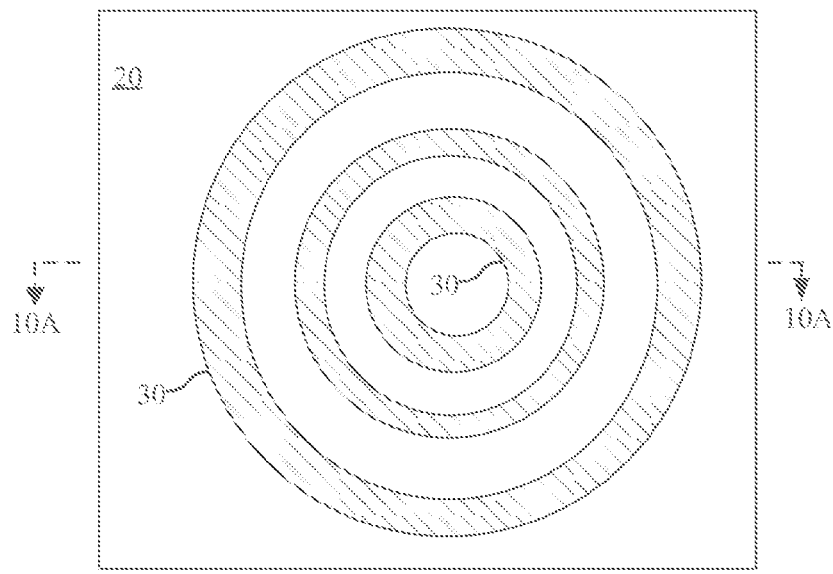

FIG. 10, which includes FIG. 10A-10C, illustrates a semiconductor device during fabrication after forming a structured masking layer in accordance with an embodiment of the present invention, wherein FIG. 10A illustrates a cross-sectional view and FIGS. 10B and 10C illustrate top views.

As next illustrated in FIG. 10A, a plurality of oxide regions 30 are formed after exposing the substrate 10 to an oxidation process. The oxidation process may be similar to the oxidation process described in the prior embodiment. In various embodiments, the oxide regions 30 may be formed as circular regions (FIG. 10B), concentric trenches (FIG. 10C), and/or rectangular trenches. After the oxidation process, the masking layer 20 is removed selectively between the outer most oxide regions 30 as shown by the mask 25.

Figure 11:
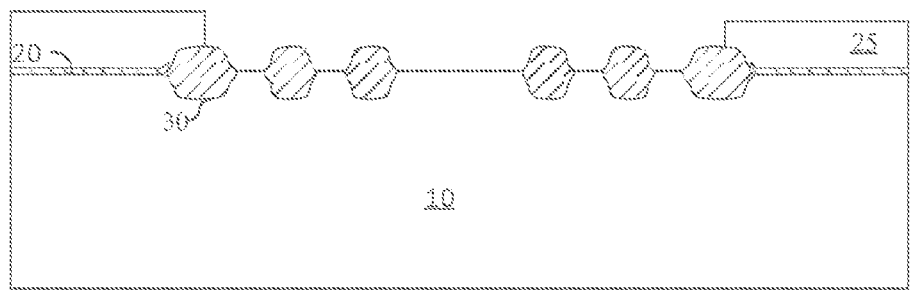

FIG. 11 illustrates a semiconductor device during fabrication after forming a resist and removing the masking layer from between the oxide regions in accordance with an embodiment of the present invention. As illustrated in FIG. 11, the masking layer 20 is removed from between the oxide regions 30.

Figure 12:
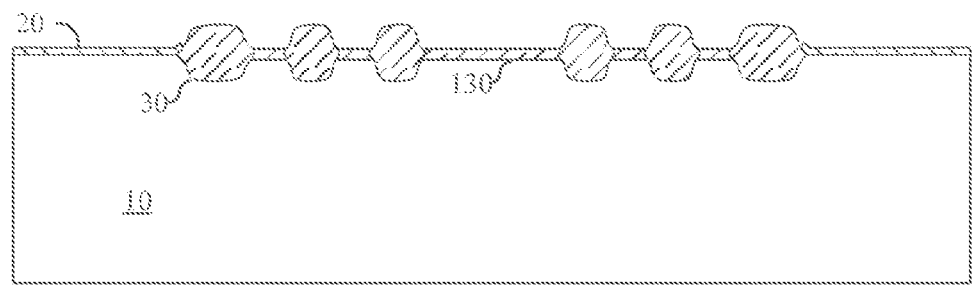

FIG. 12 illustrates a semiconductor device during fabrication after a second oxidation process in accordance with an embodiment of the present invention. The exposed surface of the substrate 10 is subjected to another oxidation process. Accordingly, a oxide layer 130 is formed over the exposed front surface of the substrate 10 between and connecting the oxide regions 30.

Figure 13:
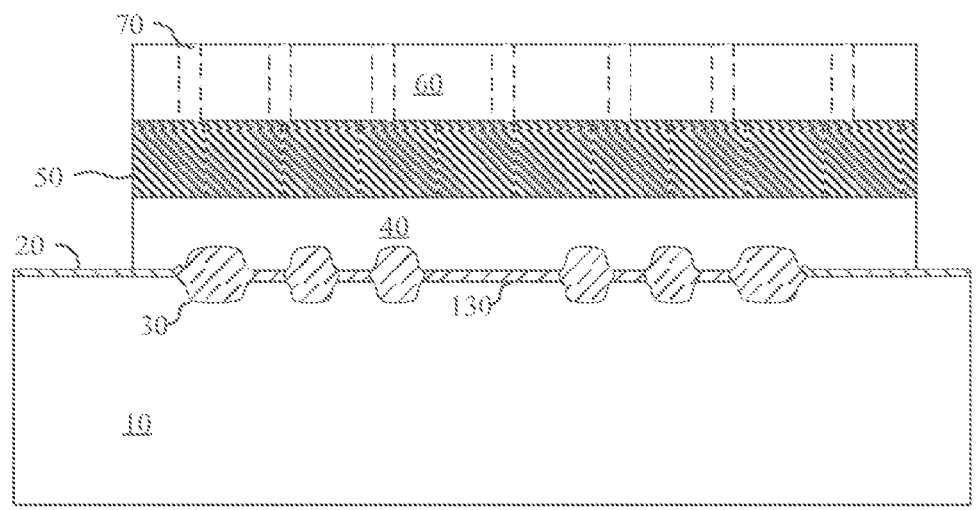

FIG. 13 illustrates a semiconductor device during fabrication after completion of front side processing in accordance with an embodiment of the present invention. As described in prior embodiments, a membrane layer 40, a removable material layer 50, and a back plate 60 are deposited and patterned. Further, contacts, spacers, and protective layers may be formed as illustrated and described with respect to FIGS. 4-5.

Figure 14:
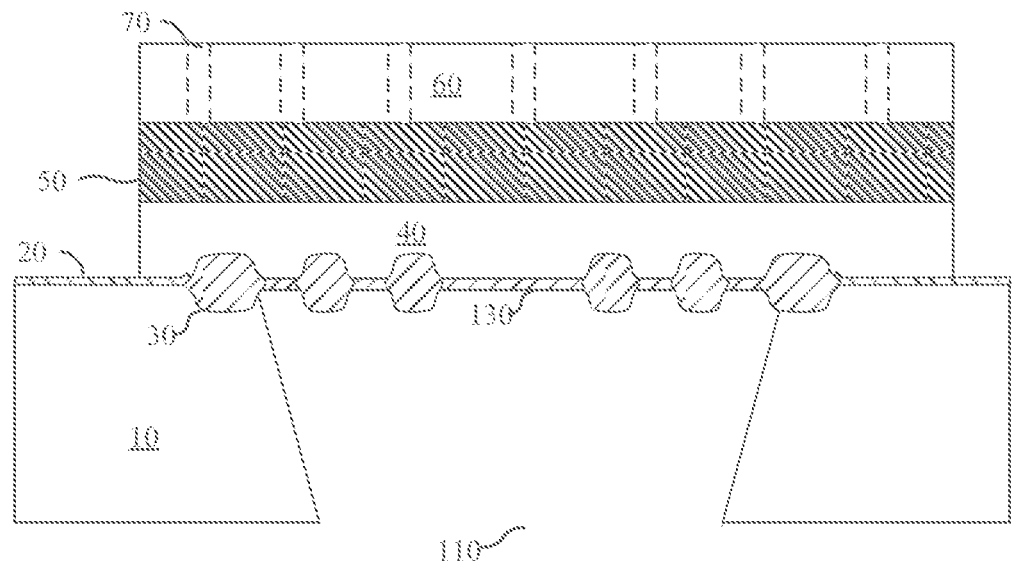

FIG. 14 illustrates a semiconductor device during fabrication after a back side cavity etch process in accordance with an embodiment of the present invention.

As described previously, the substrate 10 is reversed and the back side of the substrate 10 is masked and patterned. A back side etch process forms the first cavity 110, which stops on the oxide regions 30 and the oxide layer 130. The back side etch process may be misaligned with the location of the oxide regions 30 as described in the prior embodiment.

Figure 15:
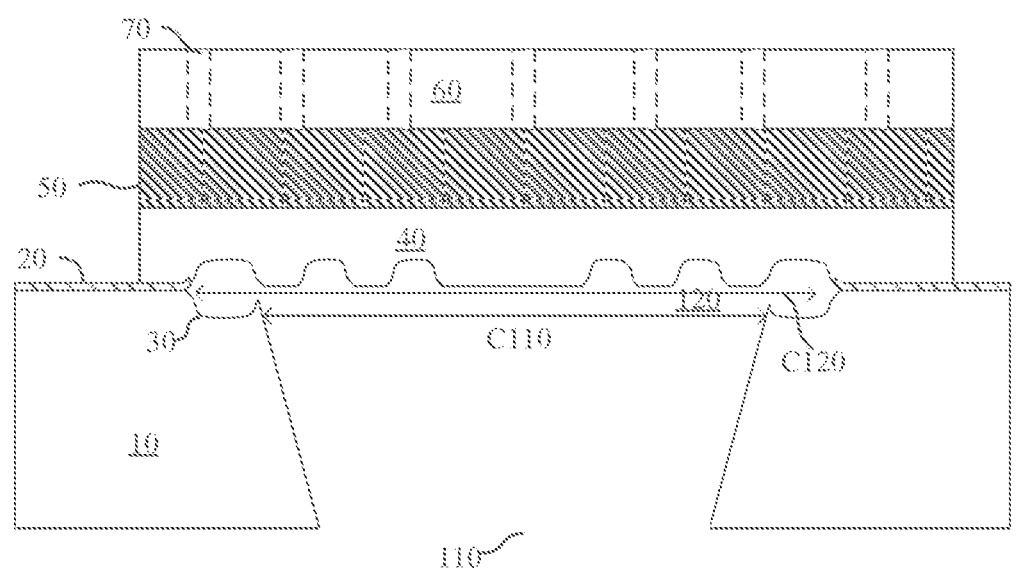

FIG. 15 illustrates a semiconductor device during fabrication after a release etch process in accordance with an embodiment of the present invention.

The oxide regions 30 and the oxide layer 130 are next removed in a single etch process. Because the oxide regions 30 and the oxide layer 130 comprise a same material, they both etch simultaneously. Thus, a second cavity 120 is formed after removing the oxide regions 30 and the oxide layer 130. Further, as long as the first cavity 110 overlaps with the oxide regions 30 completely and has a smaller diameter at the front surface 21 of the substrate 10 than the diameter of the second cavity 120 (diameter of first cavity C110 is less than the diameter of the second cavity C120), the membrane layer 40 is aligned with the second cavity 120 although the second cavity 120 may not be aligned with the first cavity 110.

Figure 16:
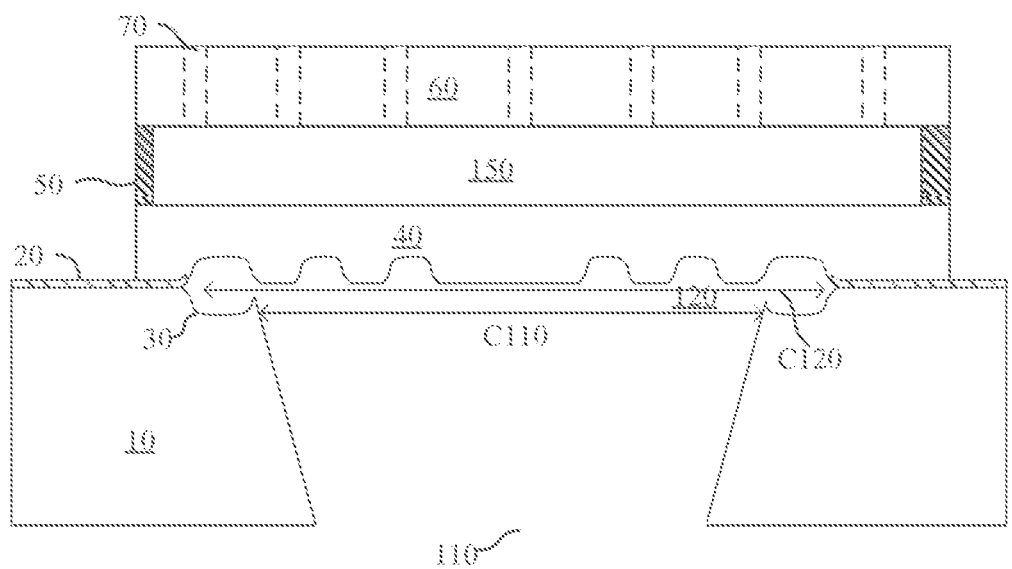

FIG. 16 illustrates a semiconductor device during fabrication after releasing the membrane layer in accordance with an embodiment of the present invention. The removable material layer 50 is etched from the front side as described in prior embodiments to form a gap 150.

FIGS. 17-23 illustrates an embodiment of fabricating the semiconductor device comprising a MEMS sensor forming a plurality of trenches from the front surface and etching these trenches from the back side of a substrate in accordance with an alternative embodiment of the invention.

In this embodiment, a plurality of trenches are formed in the substrate and filled with a sacrificial material. Further, an overfill of the sacrificial material may be used to align the inner sidewalls of the membrane layer. Thus, in this embodiment, a local oxidation process may be avoided.

Figure 17:
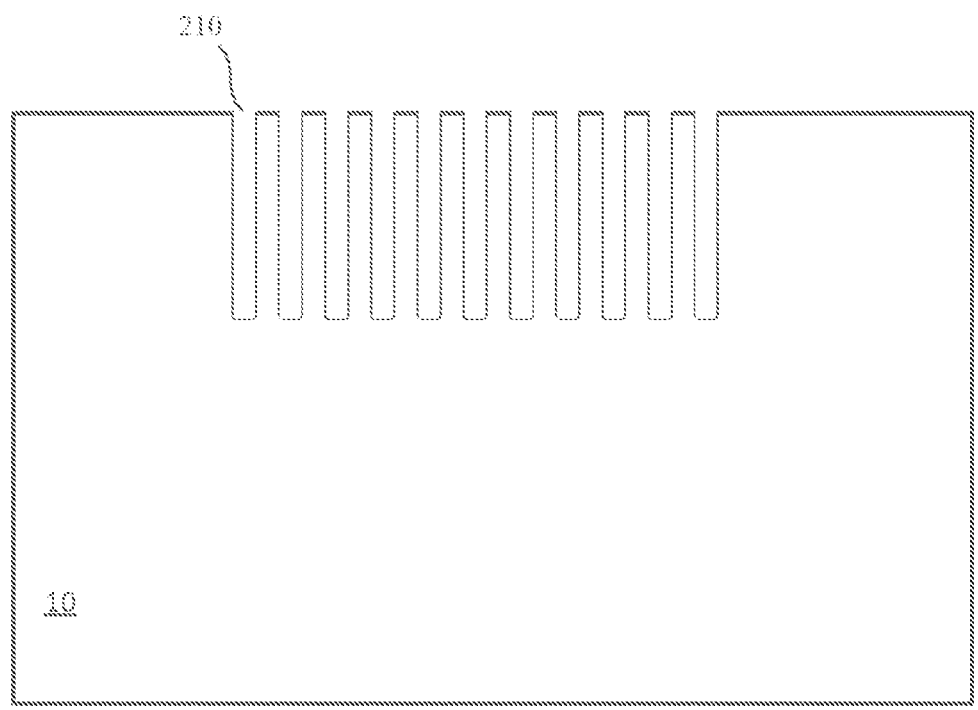
FIGS. 17-23 illustrates an embodiment of fabricating the semiconductor device comprising a moveable membrane layer by forming a plurality of trenches from the front surface and etching these trenches from the back side of a substrate in accordance with an alternative embodiment of the invention.

FIG. 17 illustrates a semiconductor device during fabrication after forming a plurality of trenches in a substrate in accordance with an embodiment of the present invention.

In various embodiments, a plurality of trenches 210 are formed from the front side of the substrate 10. The plurality of trenches 210 may be formed using an anisotropic etching process, for example, using a reactive ion etch process. The plurality of trenches 210 may be arranged in different shapes and arrangements, for example, in concentric trenches, circular trenches, rectangular trenches as well rectangular trenches that are concentric, and combinations thereof. Some examples will be described in FIG. 25 subsequently.

In various embodiments, the plurality of trenches 210 may have a depth of about 5 μm to about 20 μm into the substrate 10 from the front surface. In one or more embodiments, the plurality of trenches 210 may be separated from one another by about 2 μm to about 4 μm. In one or more embodiments, the plurality of trenches 210 may be 1 μm to about 2 μm in width (cross-sectional diameter).

Figure 18:
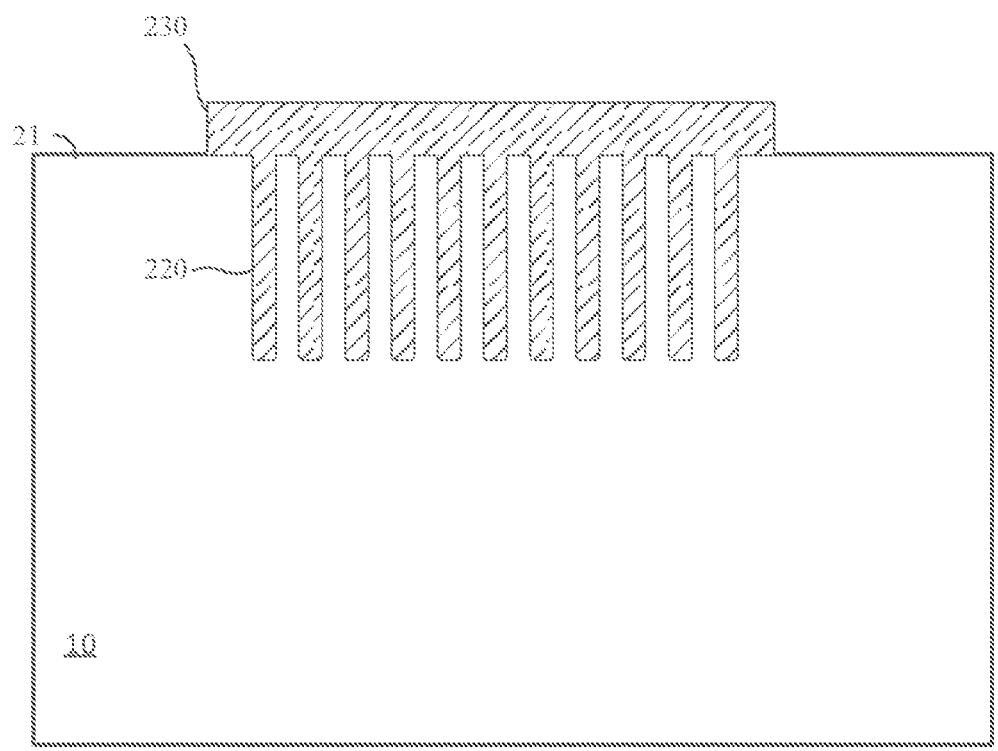

FIG. 18 illustrates a semiconductor device during fabrication after filling the plurality of trenches in accordance with an embodiment of the present invention.

A fill material 220 is deposited within the plurality of trenches 210. The fill material 220 may be deposited in one or more embodiments using a vapor deposition processes such as chemical vapor deposition, physical vapor deposition, plasma enhanced vapor deposition. In alternative embodiments, the fill material 220 may be deposited using a coating process such as a spin-on process.

In various embodiments, the fill material 220 comprise a dielectric material such a oxide, glass, as well as other low-k dielectric materials, which may be selectively removed relative to the silicon.

In one or more embodiments, the fill material 220 is allowed to form to form a overfill layer above the front surface 21. The overfilled fill material 220 may be planarized using a chemical mechanical planarization process in one embodiment. Next, the overfilled fill material 220 is patterned to form the overfill layer 230.

Figure 19:
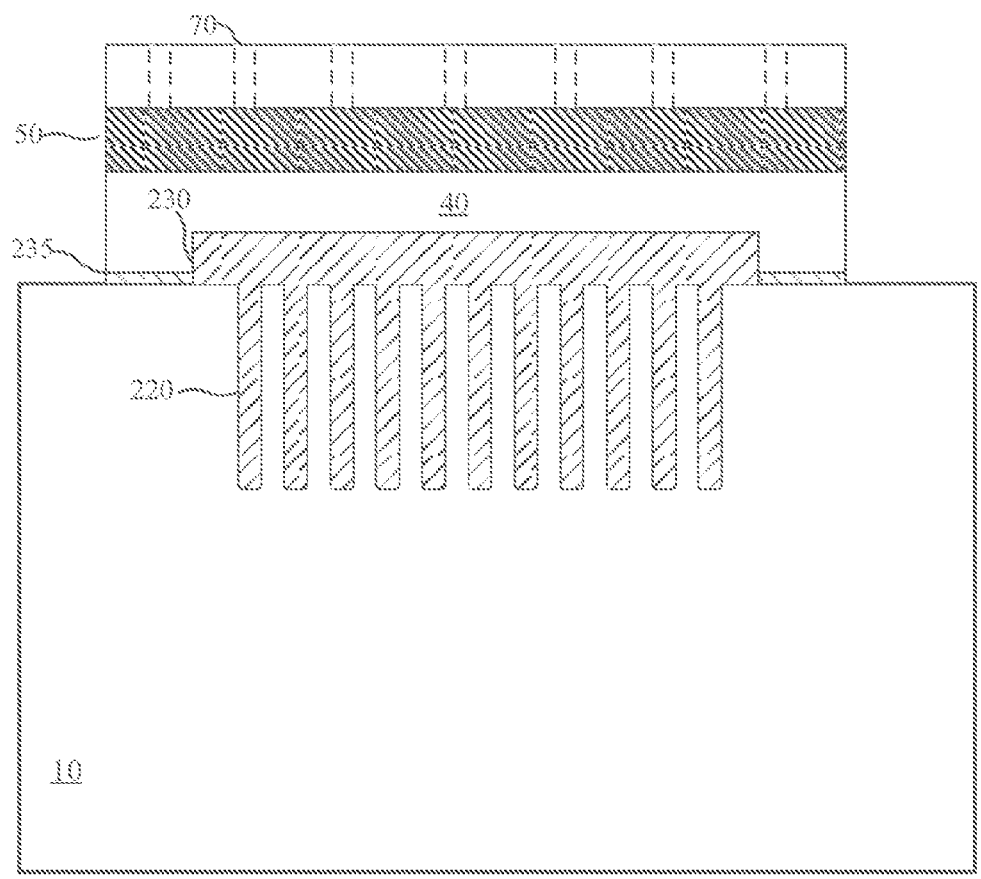

FIG. 19 illustrates a semiconductor device during fabrication after completion of front side processing in accordance with an embodiment of the present invention. An insulating layer 235 may be deposited and patterned. This may be performed prior to the formation of the overfill layer 230 in some embodiments. As described in prior embodiments, a membrane layer 40, a removable material layer 50, and a back plate 60 are deposited and patterned. Further, contacts, spacers, and protective layers may be formed as illustrated and described with respect to FIGS. 4-5.

Figure 20:
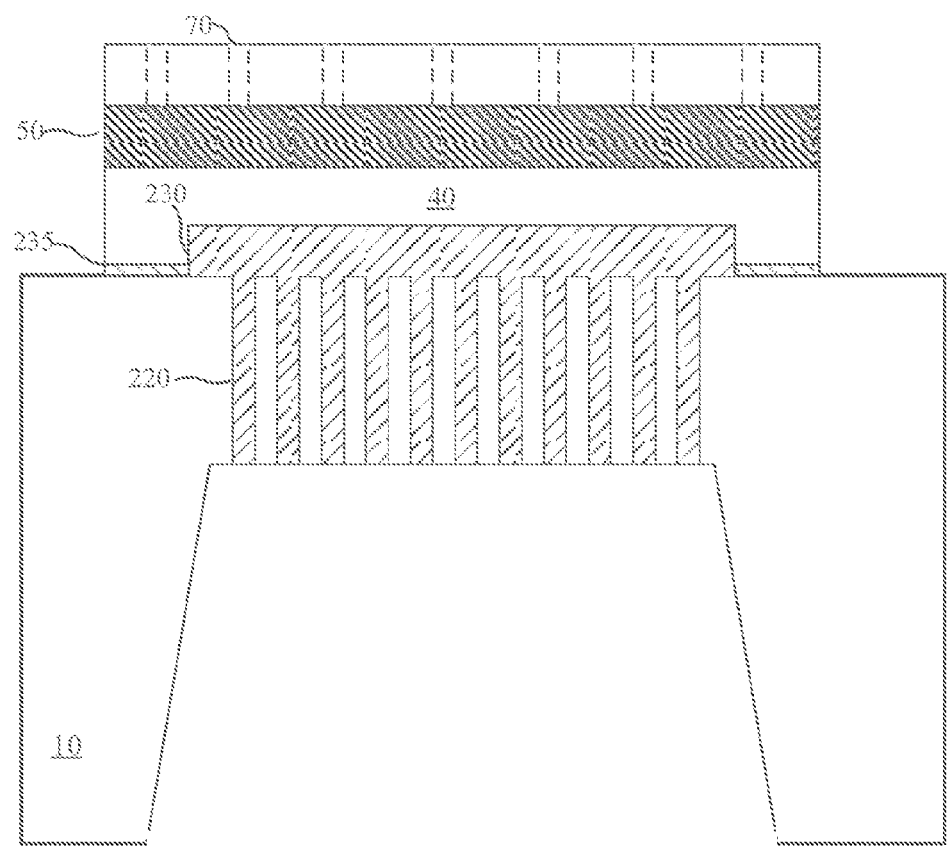

FIG. 20 illustrates a semiconductor device during fabrication after a back side cavity etching process in accordance with an embodiment of the present invention.

As described previously, the substrate 10 is reversed and the back side of the substrate 10 is masked and patterned. A back side etch process forms the first cavity 110, which stops on the plurality of trenches 210 comprising the fill material 220. The back side etch process may be misaligned with the location of the plurality of trenches 210 as in the illustration.

Figure 21:
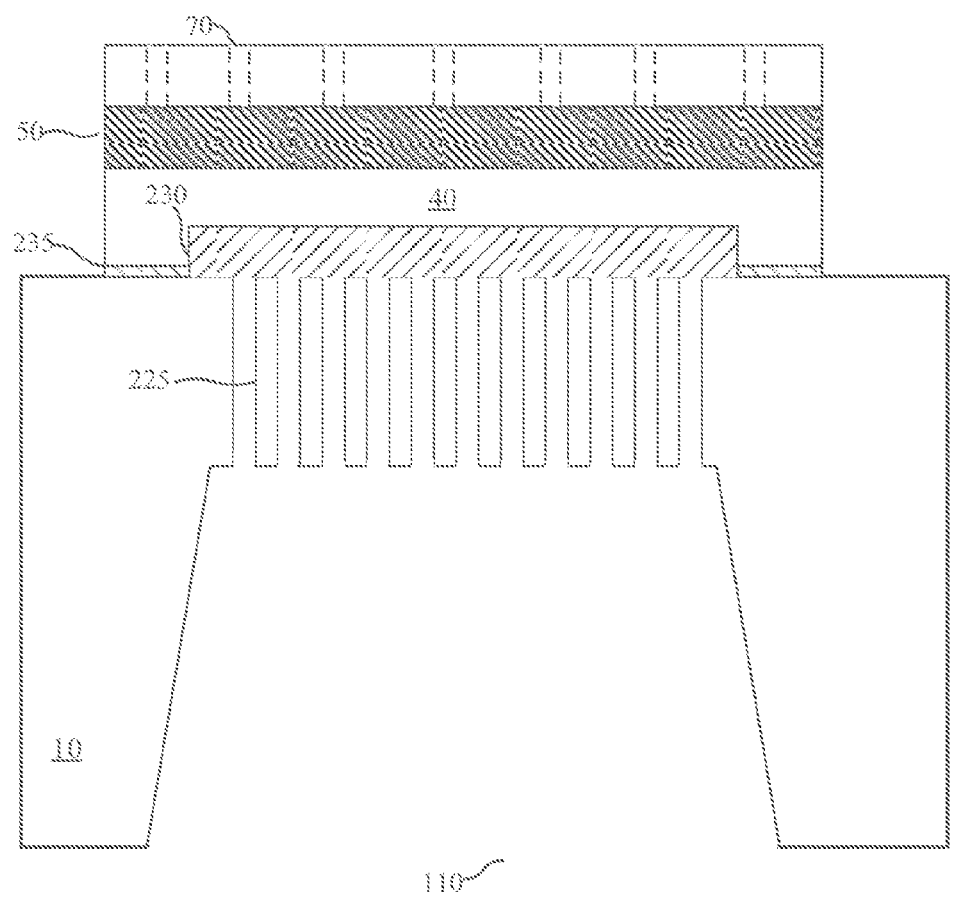

FIG. 21 illustrates a semiconductor device during fabrication after a second back side etch process in accordance with an embodiment of the present invention.

Next, in or more embodiments, a selective etch process is used to remove the fill material 220 within the plurality of trenches 210 to form a plurality of pillars 225. In various embodiments, a oxide etch may be used if the fill material 220 comprises oxide. The selective etch process may be timed and stopped on the overfill layer 230. In this embodiment, the diameter of the first cavity 110 at the bottom surface of the plurality of trenches 210 is larger than the diameter of the total area of the plurality of trenches 210. In other words, the first cavity 110 overlaps all of the plurality of trenches 210. Otherwise, some of the plurality of trenches 210 with fill material 220 may remain unetched after this process.

Figure 22:
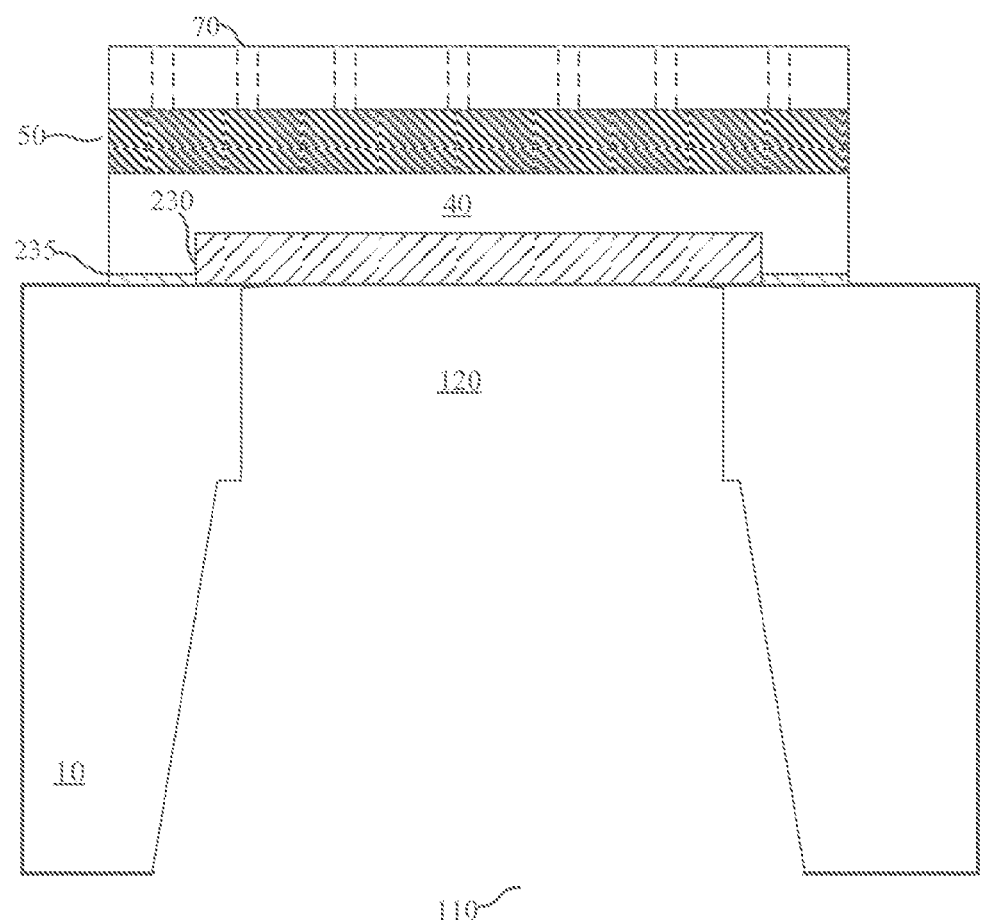

FIG. 22 illustrates a semiconductor device during fabrication after a second back side etching process in accordance with an embodiment of the present invention.

Referring next to FIG. 22, the plurality of pillars 225 are removed using an isotropic etch process to form a second cavity 120, which forms a continuous cavity under the membrane layer 40. The isotropic etch process is allowed to overetch so as to ensure that all the plurality of pillars 225 are removed and also so as to laterally expand the sidewalls of the second cavity 120.

Figure 23:
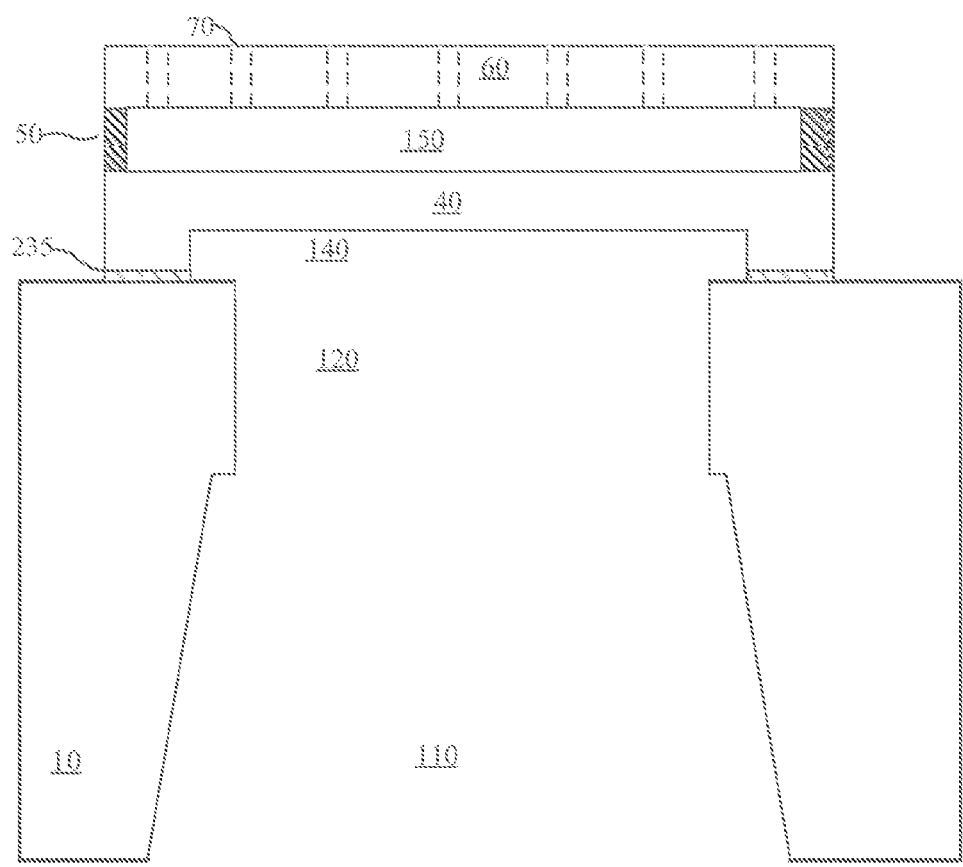

FIG. 23 illustrates a semiconductor device during fabrication after a release etch process in accordance with an embodiment of the present invention.

The overfill layer 230 is removed using a wet etch process. Thus, a third cavity 140 is formed. Further, as long as the first cavity 110 overlaps with the plurality of trenches 210 completely, the membrane layer 40 is aligned with the third cavity 140 although the third cavity 140 may not be aligned with the first cavity 110. Further, the membrane layer 40 is aligned with the second cavity 120. As described in prior embodiments, the removable material layer 50 is etched from the front side to form a gap 150.

Figure 24:
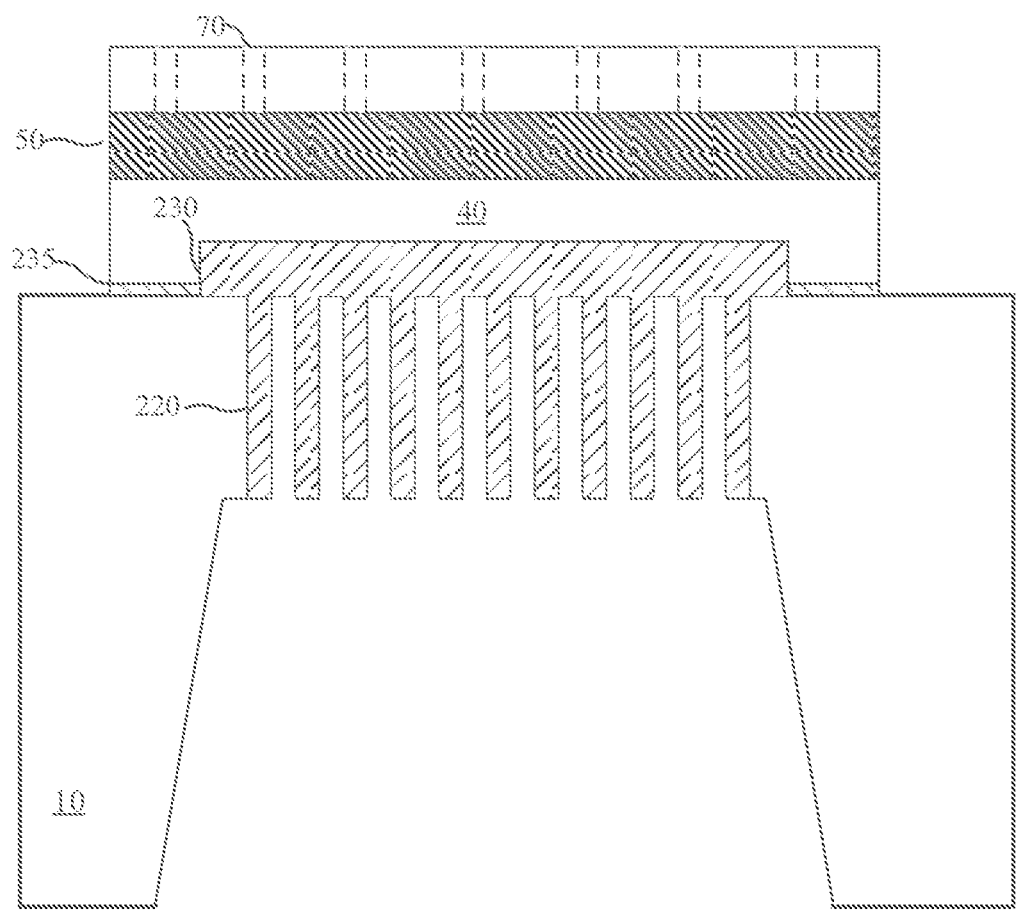
FIG. 24 illustrates an alternative embodiment of forming the semiconductor device comprising a moveable membrane layer by forming a plurality of trenches from the front surface and etching these trenches from the back side of a substrate.

FIG. 24 illustrates an alternative embodiment of forming the semiconductor device. This embodiment follows the processes described with respect to FIGS. 17-20. However, instead of removing the fill material 220, the material subsequently forming the plurality of pillars 225 in the prior embodiment is removed before etching the fill material 220. Then, the fill material 220 in the plurality of trenches 210 and the overfill layer 230 may be removed, for example, using a single wet etch process.

Figure 25A:
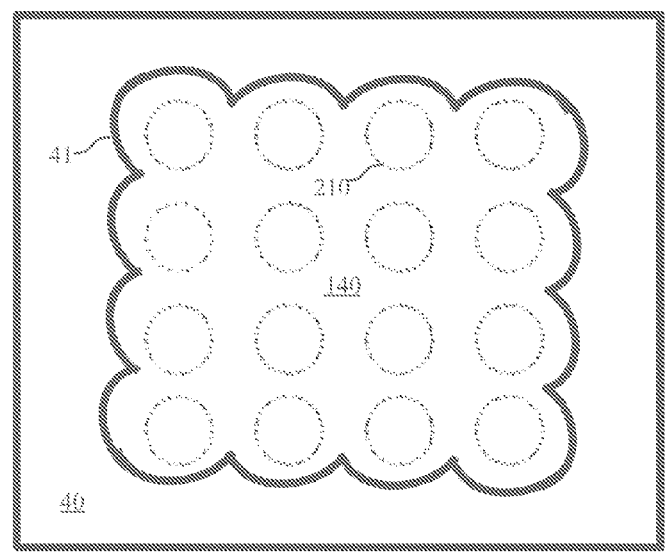
FIGS. 25A-25C, illustrates top views of a semiconductor device in accordance with an embodiment of the present invention.
Figure 25B:
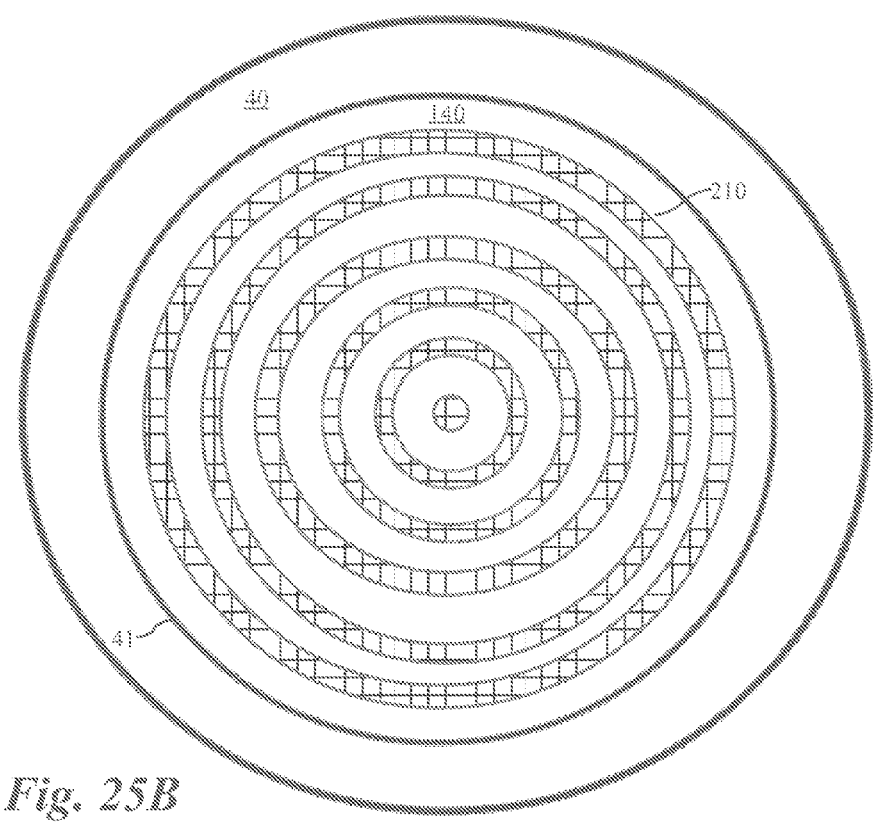
Figure 25C:
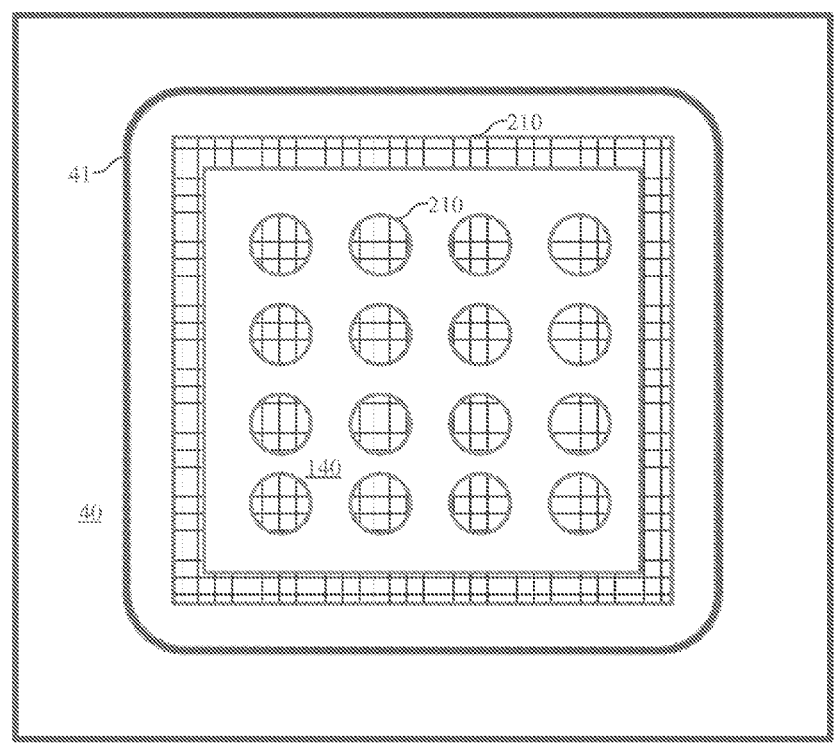

FIG. 25, which includes FIGS. 25A-25C, illustrates top views of a semiconductor device in accordance with an embodiment of the present invention.

The top views illustrate the configuration of the plurality of trenches 210 described in FIGS. 17-24. FIG. 25A illustrates that the plurality of trenches 210 are formed as circular holes. In this embodiment, the shape of the third cavity 140 (inner sidewall 41 of the membrane layer 40) is irregular. In contrast, FIG. 25B illustrates that the plurality of trenches 210 are formed as concentric trenches. In this embodiment, the shape of the third cavity 140 (inner sidewall 41 of the membrane layer 40) is circular. FIG. 25C illustrates a modification of the embodiment of FIG. 25A including a trench surrounding the circular holes. The plurality of trenches 210 are shaded in FIGS. 25B and 25C to clearly distinguish the trenches from the surrounding regions.

FIGS. 26-30 illustrate an alternative embodiment of fabricating the semiconductor device using few concentric trenches and/or with a central region with no trenches. In various embodiments, the processing follows as described in FIGS. 17-23. However, the design of the plurality of trenches 210 is different. In this embodiment, only a single outer trench is formed along the perimeter of the membrane layer 40. In an alternative embodiment, two or more concentric trenches are formed. However, even in the alternative embodiment, a central region under the membrane layer 40 has no trenches. In various embodiments, the concentric trench may be shaped in a circular shape or a rectangular shape.

Figure 26:
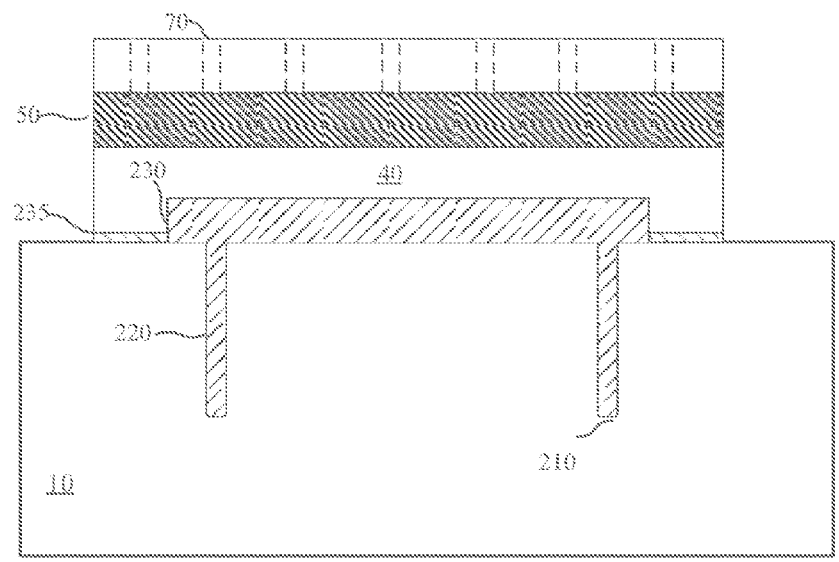
FIGS. 26-30 illustrate an alternative embodiment of fabricating the semiconductor device using few concentric trenches and/or with a central region with no trenches.

FIG. 26 illustrates a semiconductor device during fabrication after front side processing in accordance with an embodiment of the present invention.

The plurality of trenches 210 is filled with a fill material 220 and an overfill layer 230 is formed as described in prior embodiments. Further layers (membrane layer 40, removable material layer 50, back plate 60, contacts, protective layer, and others) are formed as in prior embodiments.

Figure 27:
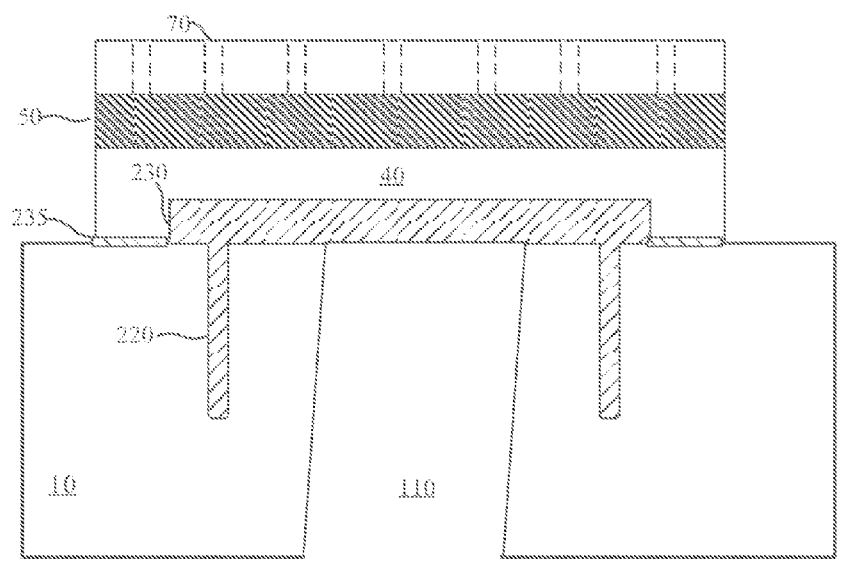

FIG. 27 illustrates a semiconductor device during fabrication after forming a cavity from the back side in accordance with an embodiment of the present invention.

Referring to FIG. 27, a first cavity 110 is formed from the back side of the substrate 10. The first cavity 110 extends up to the overfill layer 230. In various embodiments, the diameter of the first cavity 110 is smaller than the diameter of the concentric plurality of trenches 210.

Figure 28:
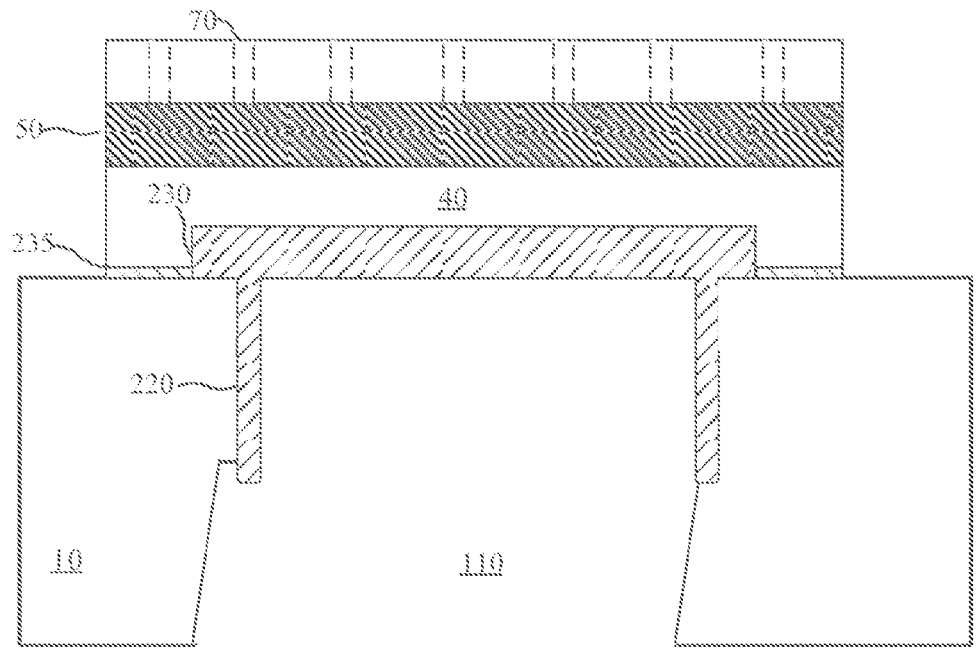

FIG. 28 illustrates a semiconductor device during fabrication after expanding the cavity from the back side in accordance with an embodiment of the present invention.

As illustrated in FIG. 28, the first cavity 110 is expanded using an isotropic etch process. As evident in FIG. 28, the isotropic etch process is stopped at the plurality of trenches 210. Therefore, even though the first cavity 110 may have been misaligned in FIG. 27, after the isotropic etch, the first cavity 110 between the plurality of trenches 210 is aligned with the membrane layer 40.

Figure 29:
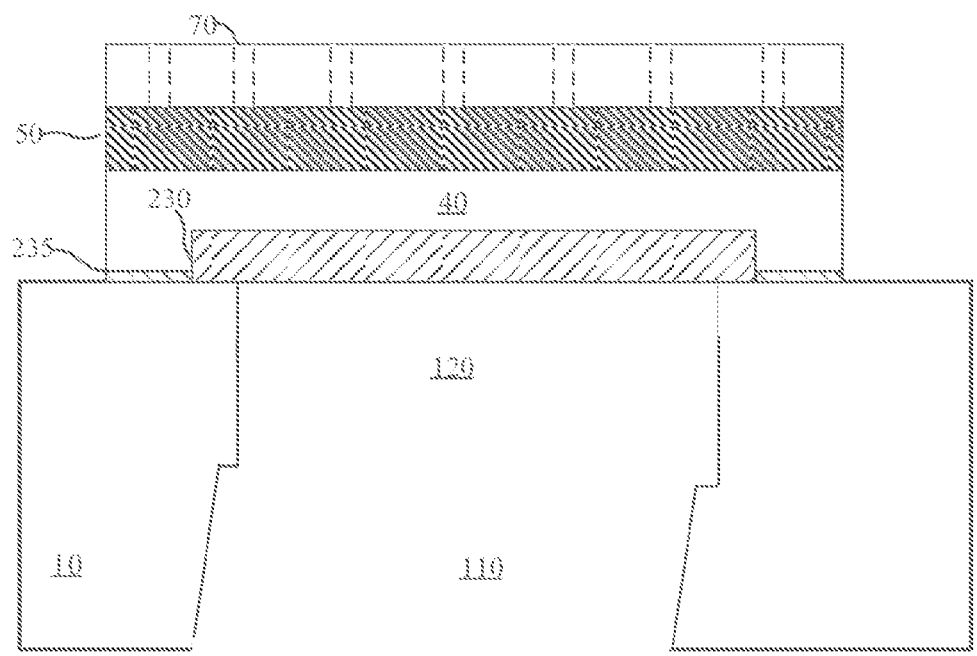

FIG. 29 illustrates a semiconductor device during fabrication after removing the fill material from the plurality of trenches in accordance with an embodiment of the present invention.

Figure 30:
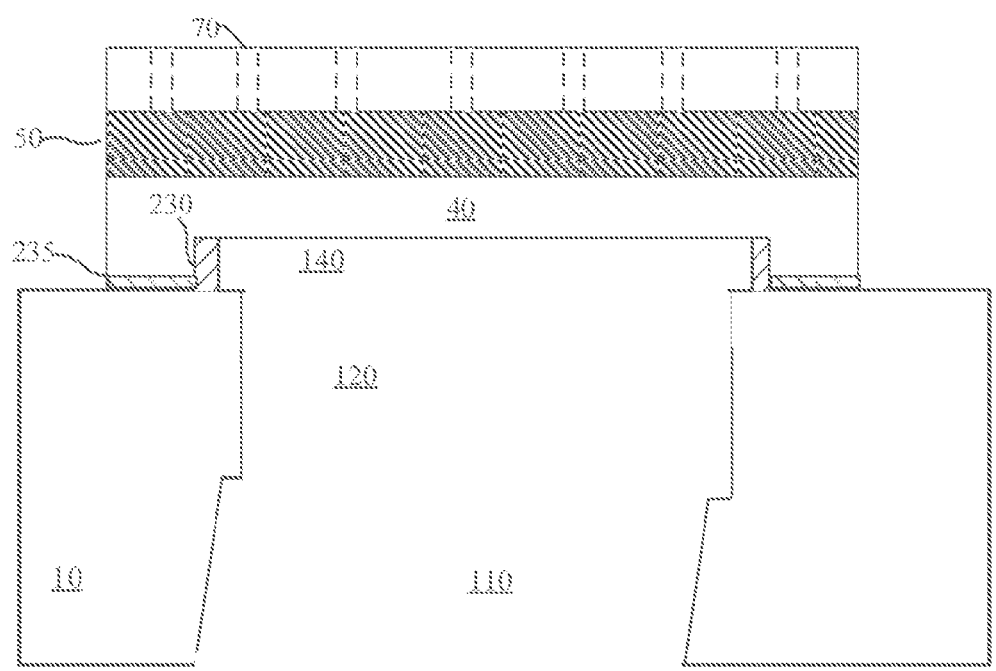

FIG. 30 illustrates a semiconductor device during fabrication after removing the overfill layer in accordance with an embodiment of the present invention.

In various embodiments, the fill material 220 from the plurality of trenches 210 and the overfill layer 230 may be removed using a single etch step that etches the fill material 220 selectively relative to the substrate 10. A small portion of the overfill layer 230 may remain in some embodiments. Subsequent processing may follow as described in other embodiments previously.

Figure 31A:
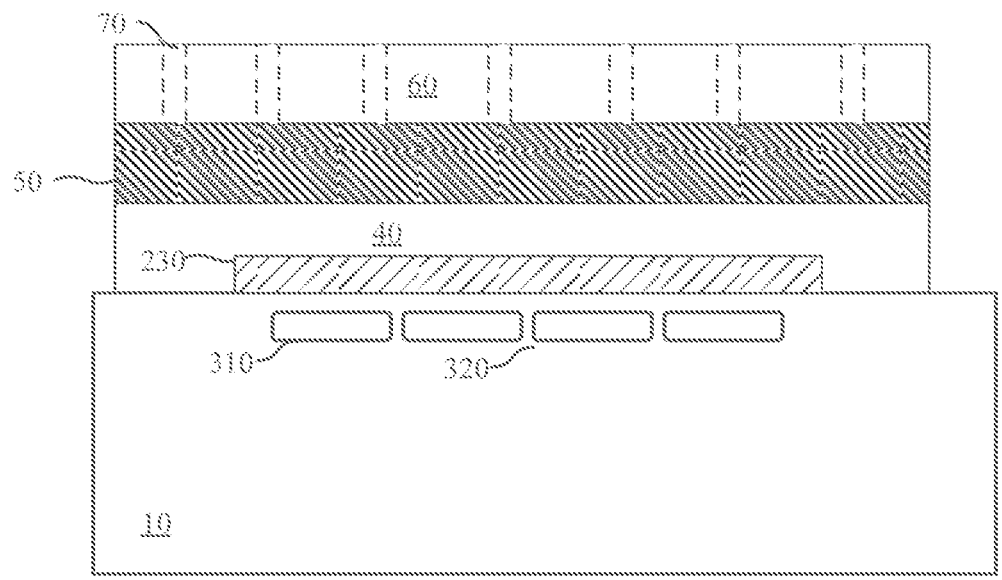
FIGS. 31-33 illustrate an alternative embodiment of fabricating the semiconductor device comprising a moveable membrane layer by forming buried cavities from the front side and etching a cavity into the buried cavity from the back side.
Figure 32:
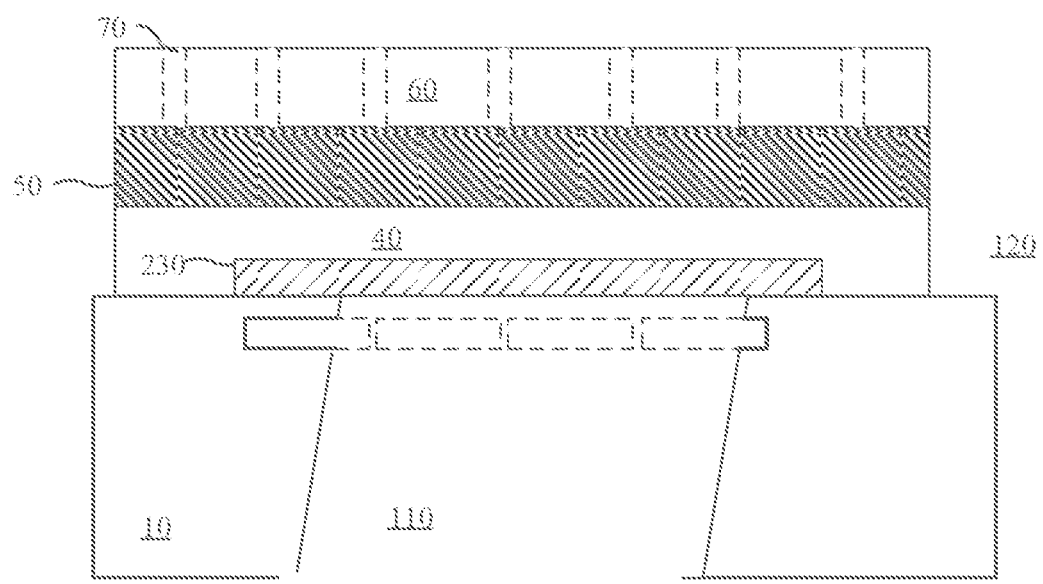
Figure 33:
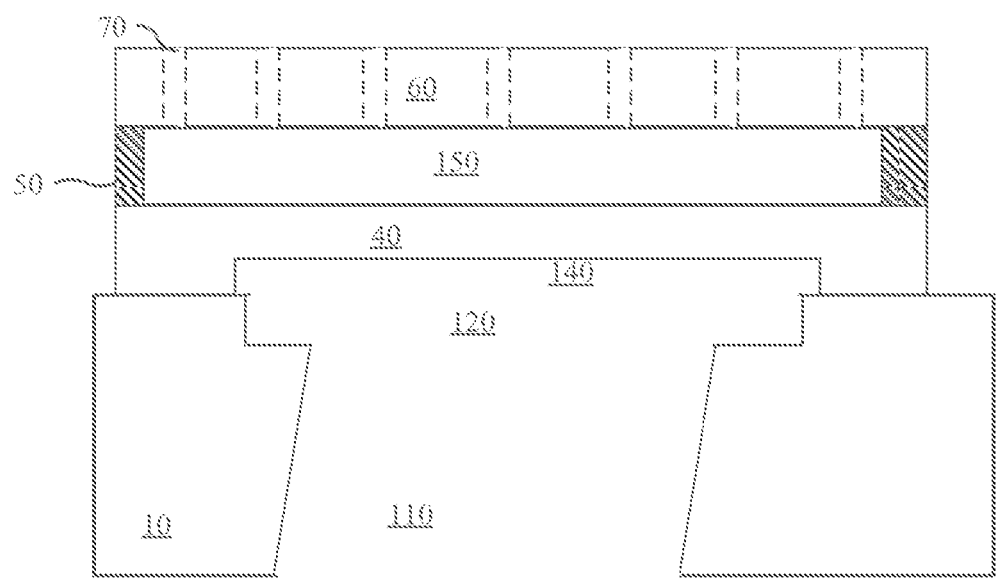

FIGS. 31-33 illustrate an alternative embodiment of fabricating the semiconductor device comprising a moveable membrane layer by forming buried cavities from the front side and etching a cavity into the buried cavity from the back side.

Figure 31B:
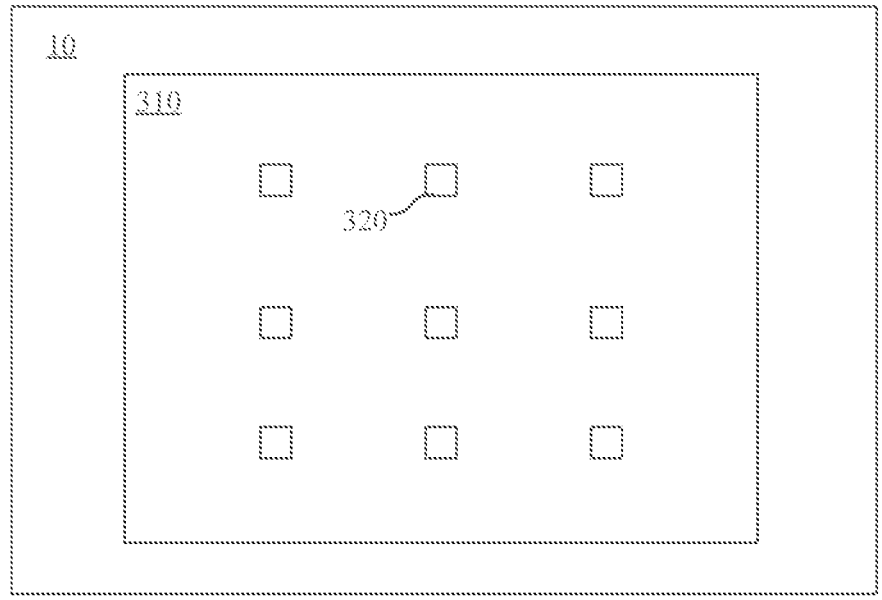
Figure 31C:
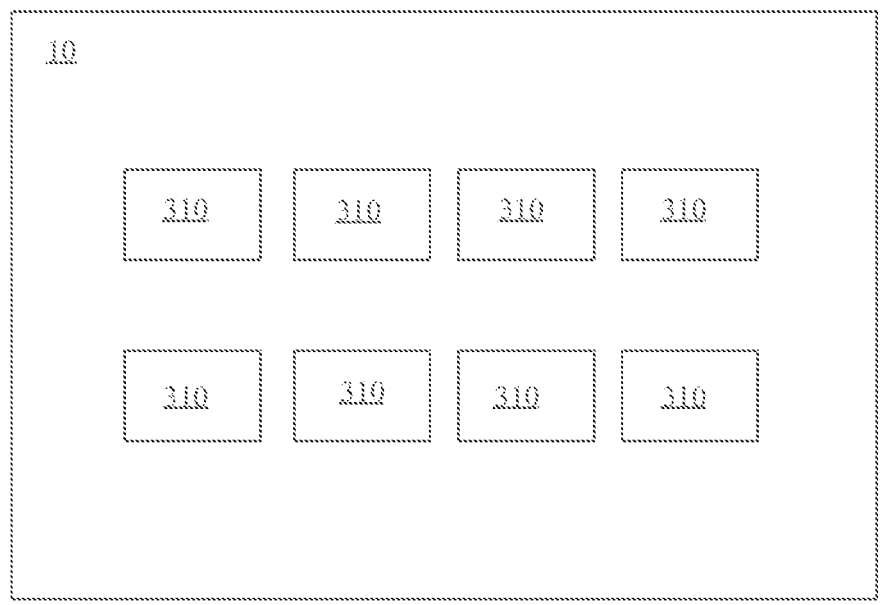

FIG. 31, which includes FIGS. 31A-31C, illustrates a substrate comprising buried cavities, wherein FIG. 31A illustrates a cross-sectional view and FIGS. 31B and 31C illustrate top views.

Referring to FIG. 31A, a buried cavity 310 may be formed under the front surface of the substrate 10. The buried cavity 310 may be formed by patterning a plurality of trenches having a very high aspect ratio, which may be covered, for example, with the overfill layer 230. The substrate 10 is then annealed in a hydrogen atmosphere so that adjacent trenches coalesce to form a buried cavity 310.

The buried cavity 310 may be supported by a plurality of supporting pillars 320. FIGS. 31B and 31C illustrate different structures of the buried cavity 310. FIG. 31B illustrates a single buried cavity 310 supported by a plurality of supporting pillars 320 while FIG. 31C illustrates a plurality of buried cavities 310.

The overfill layer 230 may be deposited over the front surface of the substrate 10 and patterned followed by the formation of the membrane layer 40, the removable material layer 50, and the back plate 60 as described previously.

After completion of front side processing, the substrate 10 is flipped as described previously.

FIG. 32 illustrates a semiconductor device after forming a first cavity and a second cavity in accordance with an embodiment of the present invention. The substrate 10 is etched from the back side as described in prior embodiments. The dimensions of the second cavity 120 are governed by the shape of the buried cavity 310. The diameter of the first cavity 110 is smaller than the diameter of the array of region with the buried cavity 310. As a consequence, the second cavity 120 is aligned to the overfill layer 230 and the inner sidewalls of the membrane layer 40.

FIG. 33 illustrates a semiconductor device after forming a third cavity in accordance with an embodiment of the present invention. An overetch process is performed which is stopped at the overfill layer 130. This expands or extends the buried cavity to the surface of the substrate 10. As described previously, the overfill layer 230 is etched forming the third cavity 140. Further processing proceeds as in prior embodiments.

FIGS. 34-42 illustrate an alternative embodiment of fabricating the semiconductor device by forming a trench array in which adjacent trenches contact each other using a multiple trench formation process from the front side and removing the trench array from the back side.

Figure 34:
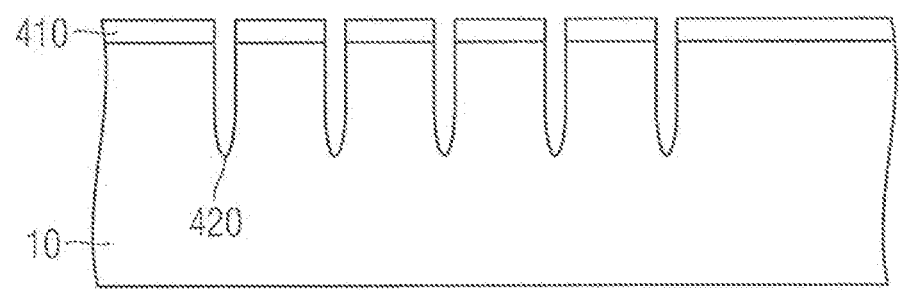
FIGS. 34-42 illustrate an alternative embodiment of fabricating the semiconductor device by forming a trench array in which adjacent trenches contact each other using a multiple trench formation process from the front side and removing the trench array from the back side.

FIG. 34 illustrates a semiconductor device after forming a first plurality of trenches in accordance with an embodiment of the present invention.

Referring to FIG. 34, a first hard mask layer 410 is deposited and patterned. Using the first hard mask layer 410, a first plurality of trenches 420 are formed within the substrate 10. The openings or width of openings in the first hard mask layer 410 is about 0.5 µm to about 2 µm. The first plurality of trenches 420 may be about 5 µm to about 20 µm deep in one or more embodiments. In one or more embodiments, the first plurality of trenches 420 may be formed using an anisotropic etch process such as a reactive ion etch process.

Figure 35:
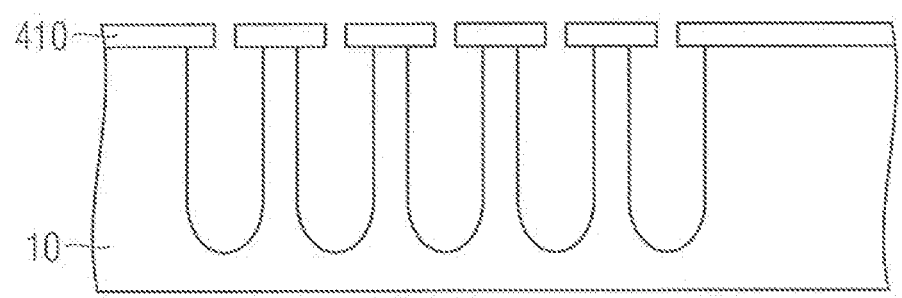

FIG. 35 illustrates a semiconductor device after widening the first plurality of trenches in accordance with an embodiment of the present invention. The first plurality of trenches 420 are widened using a isotropic etch process as illustrated in FIG. 35.

Figure 36:
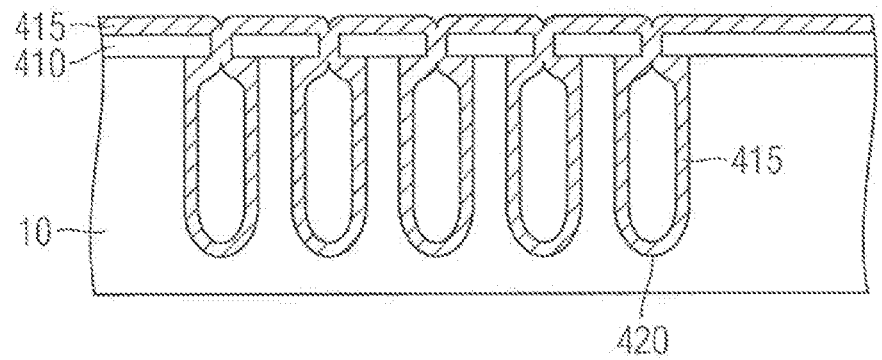

FIG. 36 illustrates a semiconductor device after closing the widened first plurality of trenches in accordance with an embodiment of the present invention.

A first fill liner 415 is deposited over the substrate 10. The first fill liner 415 may comprise an oxide configured to flow into the first plurality of trenches 420 in one embodiment. The first fill liner 415 may comprise a tetra ethyl ortho-silicate (TEOS) in one embodiment. The first fill liner 415 forms a void within the first plurality of trenches 420.

Figure 37:
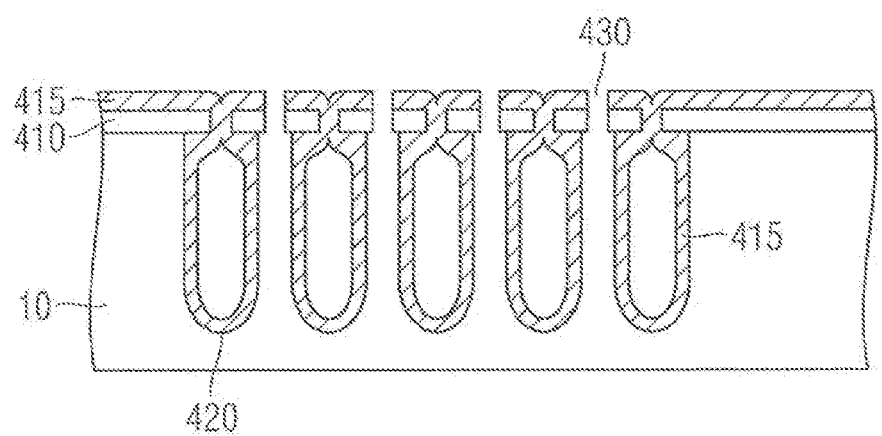

FIG. 37 illustrates a semiconductor device after forming openings in the first fill liner and the first hard mask layer for a second plurality of trenches in accordance with an embodiment of the present invention. A resist layer (not shown) is deposited and patterned. Using the patterned resist layer, openings 430 are formed in the first hard mask layer 410 and the first fill liner 415. The opening 130 for the second plurality of trenches are formed between the openings for the first plurality of trenches 420.

Figure 38:
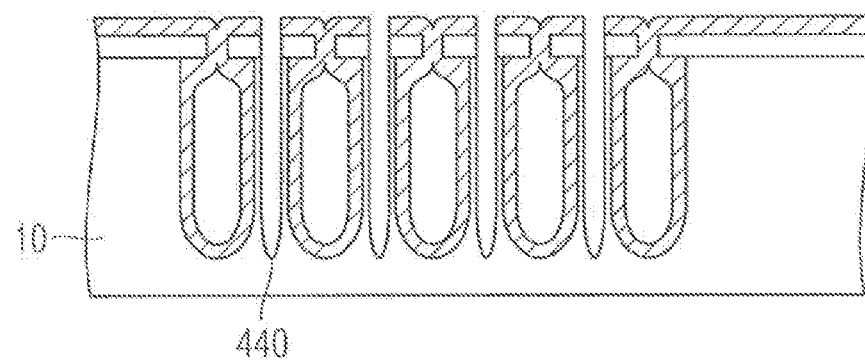

FIG. 38 illustrates a semiconductor device after forming a second plurality of trenches in accordance with an embodiment of the present invention. A second plurality of trenches 440 are formed using an anisotropic etch process. The second plurality of trenches 440 may be formed to the same depth as the first plurality of trenches 420 in one embodiment.

Figure 39:
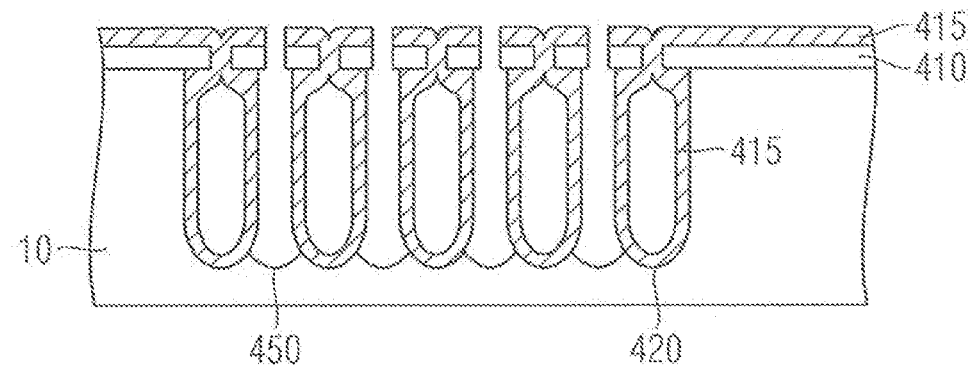

FIG. 39 illustrates a semiconductor device after widening the second plurality of trenches in accordance with an embodiment of the present invention. The second plurality of trenches 440 are widened using an isotropic etch process, which is selective to the substrate 10. As a consequence, the first fill liner 415 is not removed. The isotropic etch is stopped when the etching front reaches the sidewall of the first plurality of trenches 420 thereby forming linking trenches 450 between the first plurality of trenches 420.

Figure 40:
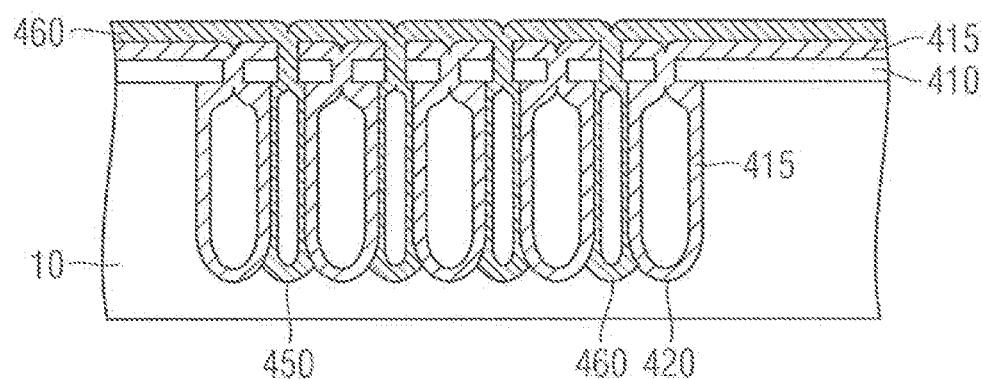

FIG. 40 illustrates a semiconductor device after filling the second plurality of trenches with a second fill liner in accordance with an embodiment of the present invention. A second fill liner 460 is deposited over the substrate 10. The second fill liner 460 may form a void within the linking trench 450 and lines the sidewalls of the linking trench 450. Thus, the second fill liner 460 contacts the first fill liner 415. The second fill liner 460 may comprise an oxide configured to flow into the linking trenches 450 in one embodiment. The second fill liner 460 may comprise a tetra ethyl ortho-silicate (TEOS) in one embodiment. The first fill liner 415 and the second fill liner 460 comprise a same material in various embodiments.

Figure 41:
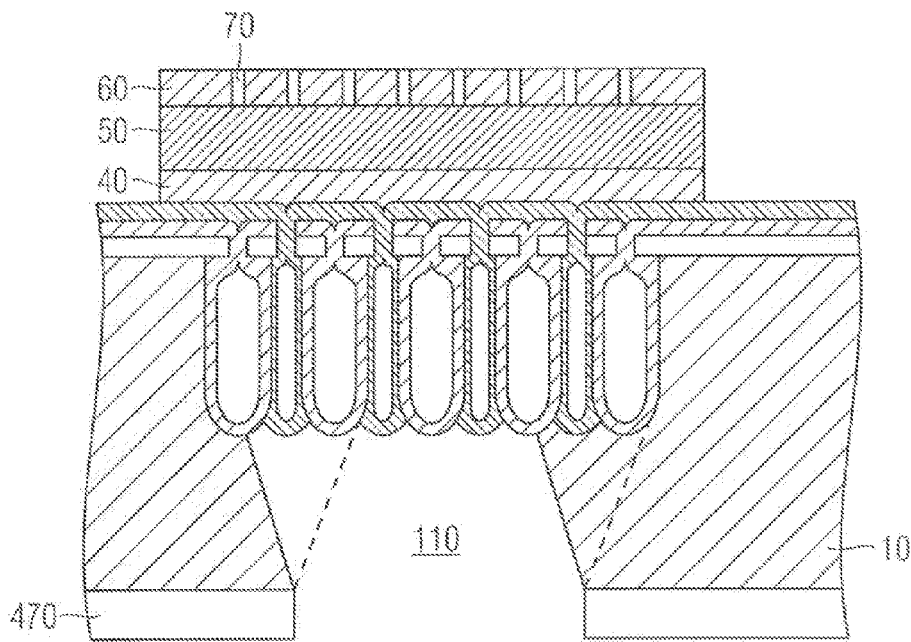

FIG. 41 illustrates a semiconductor device after forming a back side cavity in accordance with an embodiment of the present invention.

A back side hard mask 470 is deposited on the back surface of the substrate 10 and patterned. The first cavity 110 is etched from the back side of the substrate 10 as in prior embodiments. The diameter of the first cavity 110 is smaller than the diameter of the trench array comprising the first plurality of trenches 420 and the linking trenches 450 in various embodiments. The first cavity 110 may be misaligned with the location of the first plurality of trenches 420 and the linking trenches 450. The cavity etch forming the first cavity 110 stops on the first plurality of trenches 420 and the linking trenches 450 because of the slower or negligible etch rates of the first and the second fill liners 415 and 460, for example, when subjected to a silicon etching chemistry.

Figure 42:
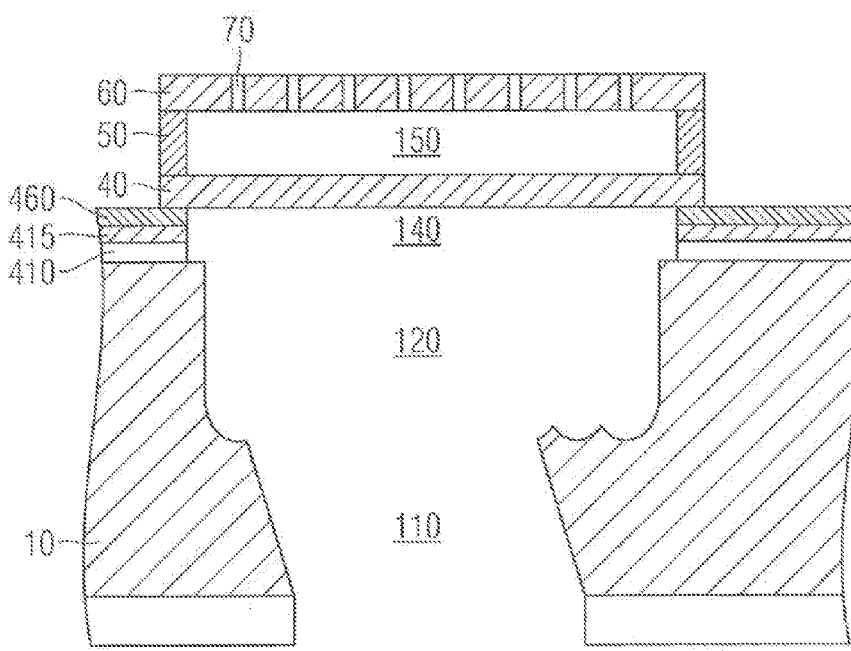

FIG. 42 illustrates a semiconductor device after releasing the membrane layer in accordance with an embodiment of the present invention.

The first and the second fill liners 415 and 460, the overfill layer 230 may be removed using a single etch process. For example, the first and the second fill liners 415 and 460 and the first hard mask layer 410 may be etched using a single process. In another embodiment, after etching the first and the second fill liners 415 and 460, the first hard mask layer 410 may be etched.

Figure 43:
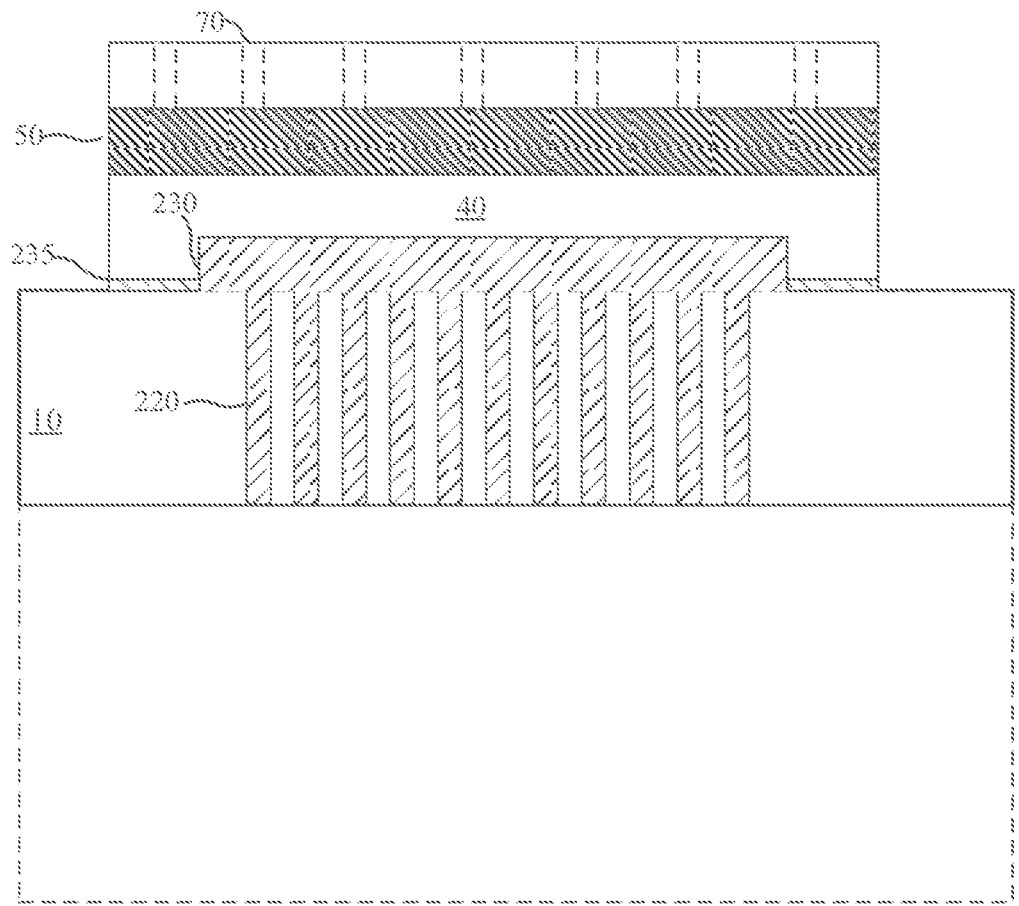
FIGS. 43 and 44 illustrate an alternative embodiment of fabricating the semiconductor device by forming a trench array from the front side and removing the trench array from the back side after a thinning process.
Figure 44:
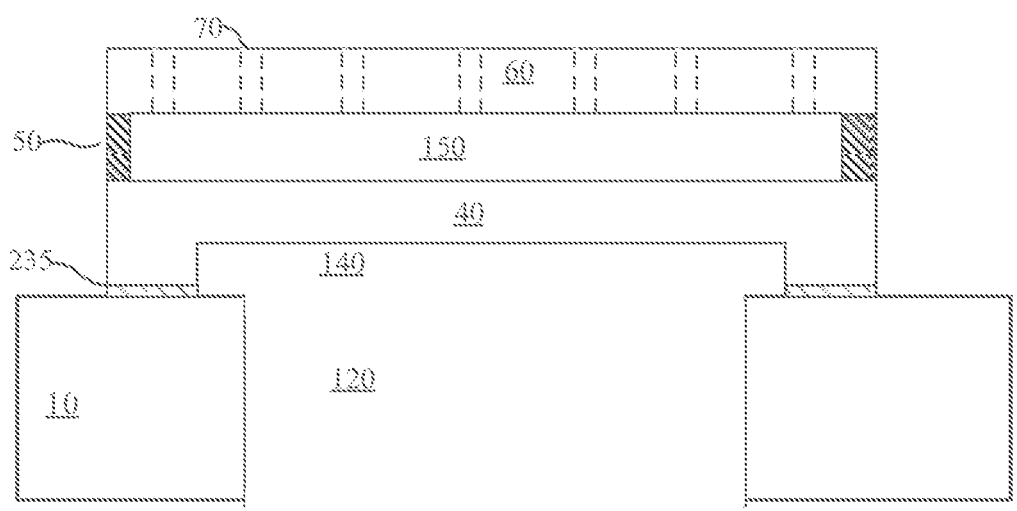

FIGS. 43 and 44 illustrate an alternative embodiment of fabricating the semiconductor device by forming a trench array from the front side and removing the trench array from the back side after a thinning process.

In this embodiment, a thinning process is used instead of the deep etching process as described in various embodiments. The thinning process may be implemented in any of the embodiments described in FIGS. 1-42. As an illustration, FIG. 43 illustrates thinning the substrate 10 to expose a bottom surface of the plurality of trenches 220, for example, as described in FIGS. 17-19. Instead of an etching process as illustrated in FIG. 20, a grinding process may be used to thin the substrate 10. Accordingly, after the thinning process, subsequent processes may follow the embodiment described in FIGS. 21-23 so as to form the second cavity 120 and the third cavity 140 as illustrated in FIG. 44.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. As an illustration, the embodiments described in FIGS. 1-42 may be combined with each other in alternative embodiments. It is therefore intended that the appended claims encompass any such modifications or embodiments.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
   a first cavity disposed in a substrate having a first surface and an opposite second surface, the first cavity extending from a first surface into a substrate;
   a second cavity disposed in the substrate, the second cavity extending from the second surface to the first cavity to form a continuous cavity, wherein the first cavity comprises a first center point, wherein the second cavity comprises a second center point, wherein the first cavity at least partially overlaps the second cavity; and
   a moveable membrane layer disposed over the second surface of the substrate, wherein a moveable portion of the moveable membrane layer comprises a third center point, wherein the third center point and the second center point are aligned.

2. The device of claim 1, wherein, along a plane parallel to the second surface, the first center point is spaced from the second center point.

3. The device of claim 1, wherein the first cavity and the second cavity have a different critical dimension along a plane parallel to the second surface.

4. The device of claim 1, wherein the first cavity comprises planar sidewalls, and wherein the second cavity comprises rounded sidewalls.

5. The device of claim 4, wherein a critical dimension of the first cavity is smaller than a critical dimension of the second cavity along a plane parallel to the second surface.

6. The device of claim 1, further comprising a third cavity disposed over the second surface of the substrate between the moveable membrane layer and the second cavity.

7. The device of claim 6, wherein the third cavity comprises a fourth center point, wherein the fourth center point and the second center point are aligned.

8. The device of claim 6, wherein an inner sidewall of the moveable membrane layer faces the third cavity.

9. A semiconductor device comprising:
   a semiconductor substrate having a first surface and an opposite second surface;
   a first cavity disposed in the semiconductor substrate, and extending from a first surface into the semiconductor substrate;
   a second cavity disposed in the semiconductor substrate, the second cavity extending from the second surface to the first cavity to form a continuous cavity, wherein the second cavity comprises trenches in the semiconductor substrate; and
   a moveable membrane layer disposed over the second surface of the substrate, wherein a moveable portion of the moveable membrane layer comprises a third center point, wherein the moveable membrane layer comprises a plurality of trenches, wherein at least one trench of the plurality of trenches faces one of the trenches in the semiconductor substrate.

10. The device of claim 9, wherein the first cavity comprises a first center point, wherein the second cavity comprises a second center point, wherein a moveable portion of the moveable membrane layer comprises a third center point, wherein the third center point and the second center point are aligned, and wherein the first center point and the second center point are not aligned.

11. The device of claim 9, wherein the plurality of trenches comprises rounded sidewalls.

12. The device of claim 9, wherein the first cavity completely overlaps the second cavity.

13. The device of claim 9, further comprising a third cavity disposed over the semiconductor substrate between the semiconductor substrate and the moveable membrane.

14. The device of claim 13, wherein the third cavity comprises an irregular shaped outer sidewall.

15. A semiconductor device comprising:
   a semiconductor substrate having a first surface and an opposite second surface;
   a first cavity disposed in the semiconductor substrate, and extending from a first surface into the semiconductor substrate, wherein the first cavity comprises slanted sidewalls;
   a second cavity disposed in the semiconductor substrate, the second cavity extending from the second surface to the first cavity to form a continuous cavity, wherein the second cavity comprises substantially vertical sidewalls;
   a moveable membrane layer disposed over the second surface of the substrate; and
   a third cavity disposed between the semiconductor substrate and the moveable membrane.

16. The device of claim 15, wherein the first cavity at least partially overlaps the second cavity.

17. The device of claim 15, wherein a critical dimension of the first cavity is larger than a critical dimension of the second cavity along a plane parallel to the second surface.

18. The device of claim 15, wherein the first cavity comprises a first center point, wherein the second cavity comprises a second center point, wherein a moveable portion of the moveable membrane layer comprises a third center point, wherein the third center point and the second center point are aligned, and wherein the first center point and the second center point are not aligned.

19. A semiconductor device comprising:
   a semiconductor substrate having a first surface and an opposite second surface;
   a first cavity disposed in the semiconductor substrate, and extending from a first surface into the semiconductor substrate;
   a second cavity disposed in the semiconductor substrate, the second cavity continuously extending to the first cavity to form a continuous cavity, wherein the second cavity comprises a buried opening comprising an opening disposed on a sidewall of the second cavity;
   a moveable membrane layer disposed over the second surface of the substrate; and
   a third cavity disposed between the second cavity and the moveable membrane.

20. The device of claim 19, wherein the first cavity comprises a first center point, wherein the second cavity comprises a second center point, and wherein, along a plane parallel to the second surface, the first center point is spaced from the second center point.

21. The device of claim 19, wherein the first cavity and the second cavity have a different critical dimension along a plane parallel to the second surface.

22. The device of claim 19, wherein the first cavity comprises a first center point, wherein the second cavity comprises a second center point, wherein a moveable portion of the moveable membrane layer comprises a third center point, wherein the third center point and the second center point are aligned, and wherein the first center point and the second center point are not aligned.

23. The device of claim 22, wherein the third cavity comprises a fourth center point, and wherein the fourth center point and the second center point are aligned.

* * * * *